(12) United States Patent
Su et al.

(10) Patent No.: US 10,672,666 B2
(45) Date of Patent: Jun. 2, 2020

(54) METHODS FOR IMPROVING INTERLAYER DIELECTRIC LAYER TOPOGRAPHY

(71) Applicant: Taiwan Semiconductor Manufacturing Co., Ltd., Hsin-Chu (TW)

(72) Inventors: Kuan-Wei Su, Kaohsiung (TW); Chun Yu Huang, Tainan (TW); Chih-Hsun Lin, Tainan (TW); Ping-Pang Hsieh, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/117,241

(22) Filed: Aug. 30, 2018

(65) Prior Publication Data

US 2020/0006152 A1 Jan. 2, 2020

Related U.S. Application Data

(60) Provisional application No. 62/690,377, filed on Jun. 27, 2018.

(51) Int. Cl.
*H01L 21/8234* (2006.01)
*H01L 27/088* (2006.01)
(Continued)

(52) U.S. Cl.
CPC .. *H01L 21/823475* (2013.01); *H01L 21/0217* (2013.01); *H01L 21/02126* (2013.01);
(Continued)

(58) Field of Classification Search
CPC ....... H01L 21/823475; H01L 21/76829; H01L 27/088
See application file for complete search history.

(56) References Cited

U.S. PATENT DOCUMENTS 7,972,962 B2 7/2011 Matsumoto et al.
9,502,305 B2 * 11/2016 Chen ................ H01L 21/26506
(Continued)

FOREIGN PATENT DOCUMENTS

EP 3229276 A1 10/2017

OTHER PUBLICATIONS

U.S. Appl. No. 15/796,992, filed Oct. 30, 2017 by inventors C. Wu, C. Cheng, S Chen, S. Yang, W. Chang, C. Kuo, F. Shiu, C. Chen for "Surface Topography by Forming Spacer-Like Components," 23 pages of text, 12 pages of drawings.

*Primary Examiner* — Mark V Prenty
(74) *Attorney, Agent, or Firm* — Haynes and Boone, LLP

(57) ABSTRACT

Methods for improving interlayer dielectric (ILD) layer topography and resulting integrated circuit devices are disclosed herein. An exemplary method includes forming a first contact etch stop layer having a first thickness over a first region of a wafer, forming a second contact etch stop layer having a second thickness over a second region of the wafer, and forming an ILD layer over the first contact etch stop layer and the second contact etch stop layer. A first topography variation exists between the first region and the second region. The second thickness is different than the first thickness to achieve a second topography variation that is less than the first topography variation. The first topography variation can be caused by a height difference between a first gate structure disposed over the wafer in the first region and a second gate structure disposed over the wafer in the second region.

20 Claims, 14 Drawing Sheets

(51) Int. Cl.
*H01L 21/02* (2006.01)
*H01L 21/311* (2006.01)

(52) U.S. Cl.
CPC .. *H01L 21/02164* (2013.01); *H01L 21/02167* (2013.01); *H01L 21/31144* (2013.01); *H01L 27/088* (2013.01)

(56) References Cited

U.S. PATENT DOCUMENTS 9,508,814 B2 * 11/2016 Wang ................ H01L 21/76834
2008/0224227 A1 9/2008 Ko et al.
2010/0059831 A1 3/2010 Lee et al.

* cited by examiner

METHODS FOR IMPROVING INTERLAYER DIELECTRIC LAYER TOPOGRAPHY

This is a non-provisional application of and claims benefit of U.S. Provisional Patent Application Ser. No. 62/690,377, filed Jun. 27, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, these advances have also increased complexity of manufacturing ICs and, for these advances to be realized, similar developments in IC processing and manufacturing are needed.

For example, IC fabrication typically involves forming a device layer that includes various IC devices on a wafer (substrate) and then forming a multilayer interconnect (MLI) feature over the device layer that facilitates operation of the various IC devices. In some implementations, the MLI feature includes an interlayer dielectric (ILD) layer disposed over the device layer and intermetal dielectric (IMD) layers disposed over the ILD layer. The IMD layers include electrically conductive interconnect structures (for example, metal interconnect structures) that are configured to route and/or distribute signals between the IC devices and/or components of the IC devices. Since topography of the ILD layer conforms to topography of underlying layer(s), such as the device layer, any topography variation in the underlying layer(s) is often transferred to the ILD layer. For example, height variation among the IC devices that cause topography variation in the device layer (in other words, some regions of the device layer are "taller" or "shorter" than other regions) lead to the ILD layer exhibiting topography variation even after performing a planarization process (for example, a chemical mechanical polishing process). Such topography variation can lead to degraded IC device performance or even IC device failure. Accordingly, although existing IC fabrication methods have been generally adequate for their intended purposes, they have not been entirely satisfactory in all respects (for example, in inadequately controlling ILD topography).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
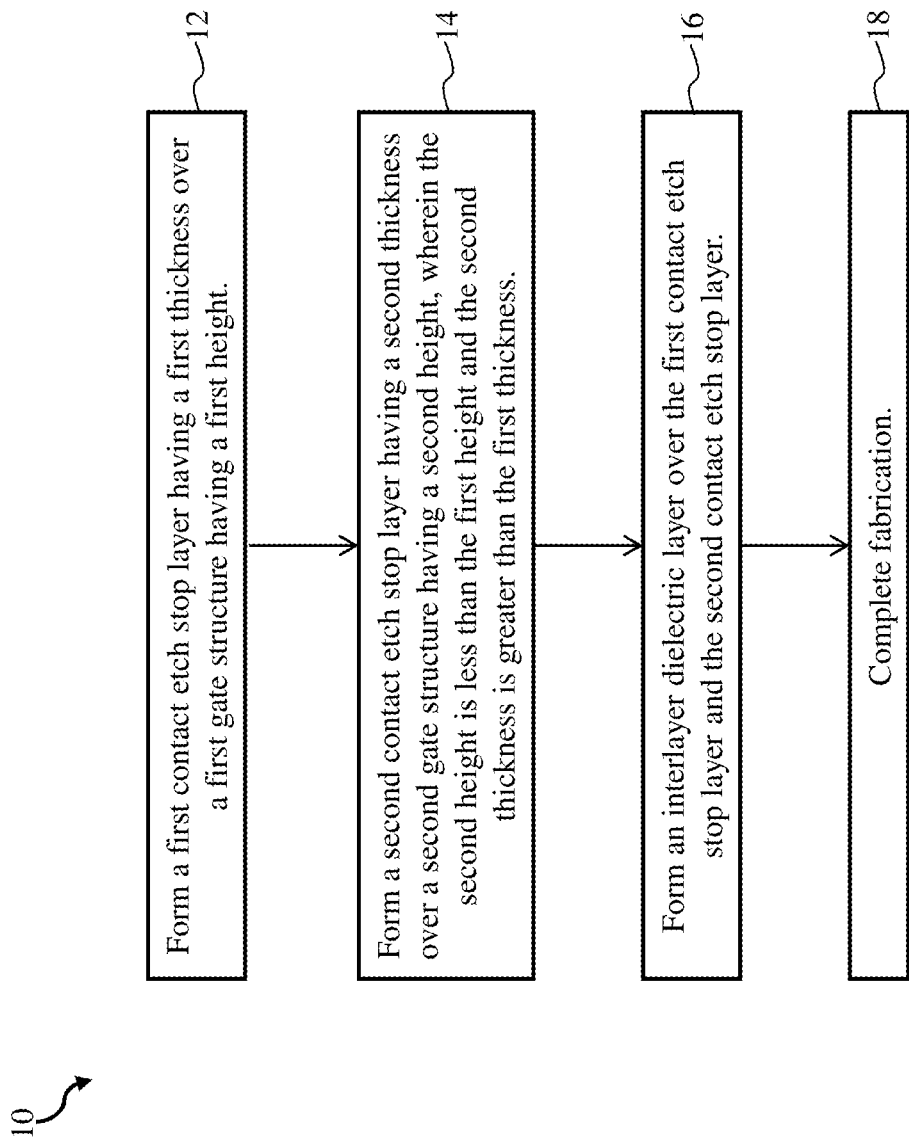
FIG. 1 is a flow chart of a method for fabricating an integrated circuit device according to various aspects of the present disclosure.

The present disclosure relates generally to integrated circuit (IC) devices, and more particularly, to methods for improving interlayer dielectric layer (ILD) topography of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As IC technologies continue to progress towards smaller technology nodes (for example, 20 nm, 16 nm, 10 nm, 7 nm, and below), new fabrication challenges arise. One such challenge pertains to topography variations that arise during IC fabrication. Topography variations occur when some regions of a wafer are "taller" (for example, have a greater vertical height) than other regions of the wafer, or vice versa. The "taller" or "shorter" regions may include various layers, such as semiconductor layers, dielectric layers, and/or conductive (for example, metal) layers. Topography variations often did not impact older technology generations because IC device sizes for the older technology generations either exceeded the topography variations or were big enough compared to the topography variations, thereby muting any impact or problems from the topography variations. As such, conventional IC fabrication methods have not devised satisfactory solutions for addressing the challenges caused by topography variations in advanced technology nodes.

For example, IC fabrication typically involves forming a device layer that includes various IC devices on a wafer (substrate) and then forming a multilayer interconnect (MLI) feature over the device layer that facilitates operation of the various IC devices. In some implementations, the MLI feature includes a contact etch stop layer (CESL) disposed over the device layer, an ILD layer disposed over the CESL layer, and intermetal dielectric (IMD) layers disposed over the ILD layer. The IMD layers include electrically conductive interconnect structures (for example, metal interconnect structures) that are configured to route and/or distribute signals between the IC devices and/or components of the IC devices. Since topography of the CESL layer and the ILD layer conform to topography of underlying layer(s), such as the device layer, any topography variation in the underlying layer(s) is often transferred to the ILD layer. For example, height variation among the IC devices that cause topography variation in the device layer (in other words, some regions of the device layer are "taller" or "shorter" than other regions) lead to the CESL layer (which typically has the same thickness over the various IC devices of the device layer) and the ILD layer exhibiting topography variation even after performing a planarization process. Such topography variation can lead to degraded IC device performance or even IC device failure.

The present disclosure thus proposes minimizing an effect of topography variation of the device layer on topography variation of the ILD layer by implementing different thickness CESLs over different height device features. Utilizing different thickness CESLs on different height devices can "smooth" topography variations in the device layer, such that subsequently formed ILD layers exhibit "smoother" topography. A number of advantages are described herein by implementing such technique. Different embodiments may have different advantages, and no particular advantage is necessarily required of any embodiment.

FIG. 1 is a flow chart of a method 10 for fabricating an integrated circuit device according to various aspects of the present disclosure. At block 12, a first contact etch stop layer having a first thickness is formed over a first gate structure having a first height. At block 14, a second contact etch stop layer having a second thickness is formed over a second gate structure having a second height. The second height is less than the first height. The first thickness and the second thickness are configured to minimize a topography variation. For example, the second thickness that is greater than the first thickness. At block 16, an ILD layer is formed over the first contact etch stop layer and the second contact etch stop layer. At block 18, method 10 can continue with completing fabrication of the IC device. FIG. 1 has been simplified for the sake of clarity to better understand the inventive concepts of the present disclosure. Additional features can be added in method 10, and some of the features described below can be replaced, modified, or eliminated in other embodiments of method 10.

FIGS. 2A-2L are fragmentary cross-sectional views of an IC device 100, in portion or entirety, at various fabrication stages of a method, such as method 10 of FIG. 1, according to various aspects of the present disclosure. IC device 100 can be included in a microprocessor, a memory, and/or other IC device. In some implementations, IC device 100 is a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors are configured as planar transistors or multi-gate transistors, such as fin-like FETs (FinFETs), depending on design requirements of IC device 100. IC device 100 includes a device region 102, a device region 104, a device region 106, and a device region 108. Each of device regions 102-108 includes various active and/or passive microelectronic devices configured to provide a core region (often referred to as a logic region), a memory region (such as a static random access memory (SRAM) region and/or a flash memory region), an analog region, a peripheral region (often referred to as an I/O region), a dummy region, other suitable region, or combinations thereof. For example, device region 102 is a flash cell memory region (including one or more flash memories), device region 104 is a high voltage region (including one or more transistors), device region 106 is an I/O region (including one or more transistors), and device region 108 is a core region (including one or more transistors). In some implementations, high voltage region generally refers to regions of IC device 100 including transistors that operate at voltages greater than about 5 V. In some implementations, IC device 100 includes a low voltage region, which generally refers to regions of IC device 100 including transistors that operate at voltages less than about 5 V. FIGS. 2A-2L have been simplified for the sake of clarity to better understand the inventive concepts of the present disclosure. Additional features can be added in IC device 100, and some of the features described below can be replaced, modified, or eliminated in other embodiments of IC device 100.

Figure 2A:
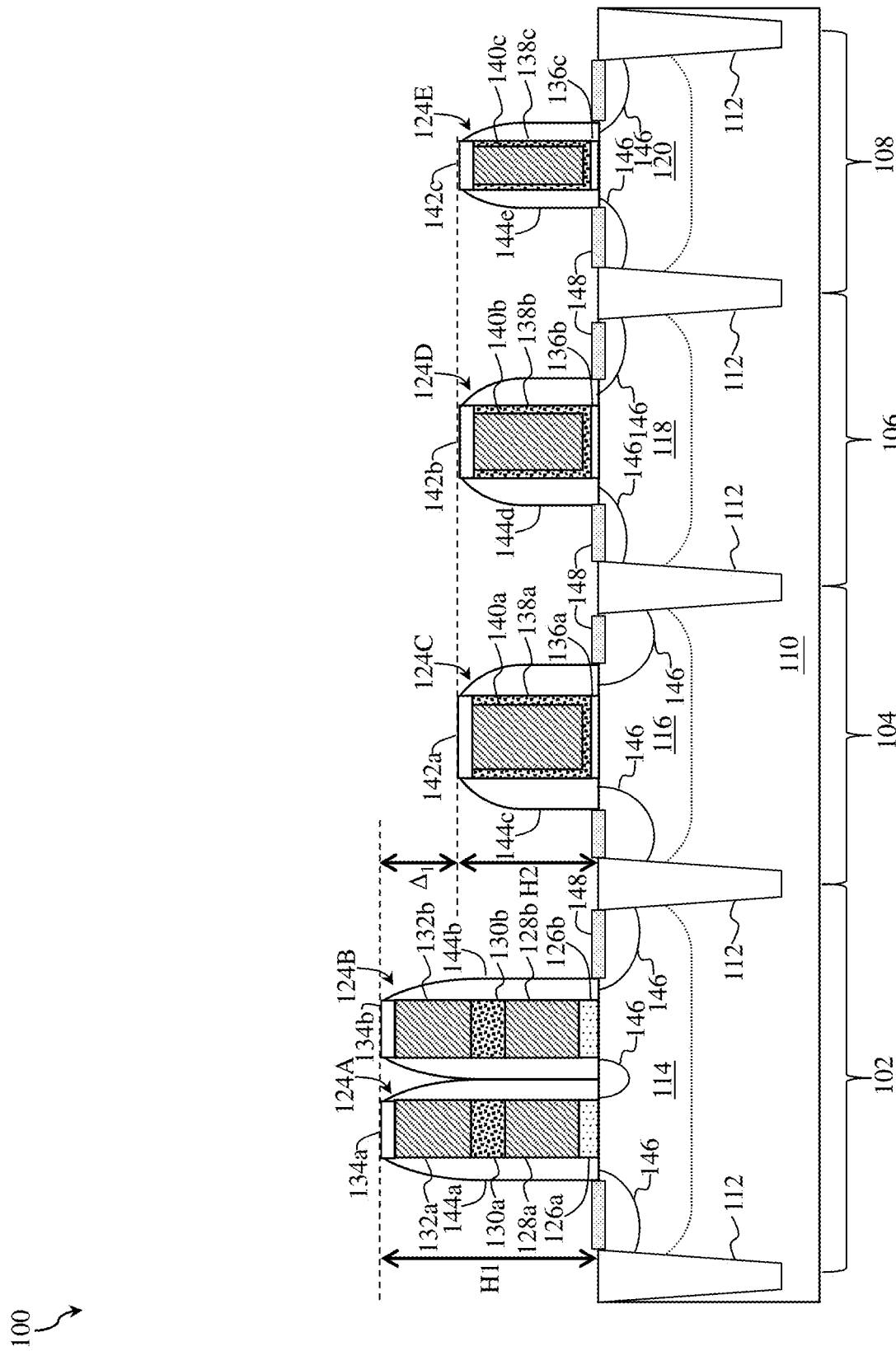
FIGS. 2A-2L are fragmentary cross-sectional views of an integrated circuit device, in portion or entirety, according to various aspects of the present disclosure.

Turning to FIG. 2A, IC device 100 includes a substrate (wafer) 110. In the depicted embodiment, substrate 110 includes silicon. Alternatively or additionally, substrate 110 includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; or combinations thereof. Alternatively, substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 110 includes one or more group III-V materials. In some implementations, substrate 110 includes one or more group II-IV materials.

Isolation features 112 are disposed over and/or in substrate 110 to isolate various device regions of IC device 100. For example, isolation features 112 separate and isolate active device regions and/or passive device regions from each other, such as device regions 102-108. Isolation features 112 include silicon oxide, silicon nitride, silicon oxynitride, other suitable isolation material (for example, including silicon, oxygen, nitrogen, carbon, or other suitable isolation constituent), or combinations thereof. Isolation features 112 can include different structures, such as shallow trench isolation (STI) structures, deep trench isolation (DTI) structures, and/or local oxidation of silicon (LOCOS) structures. In some implementations, STI features can be formed by etching trenches in substrate 110 (for example, by using a dry etch process and/or wet etch process) and filling the trenches with insulator material (for example, by using a chemical vapor deposition process or a spin-on glass process). A chemical mechanical polishing (CMP) process may be performed to remove excessive insulator material and/or planarize a top surface of isolation features 112. In some implementations, STI features can be formed by depositing an insulator material over substrate 110 after forming fins, such that the insulator material layer fills gaps (trenches) between fins, and etching back the insulator material layer to form isolation features 112. In some implementations, isolation features 112 include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features 112 include a dielectric layer disposed over a doped liner layer (including, for example, boron silicate glass or phosphosilicate glass).

Substrate 110 includes various doped regions configured according to design requirements of IC device 100. For example, substrate 110 includes a doped region 114, a doped region 116, a doped region 118, and doped region 120. Each of doped regions 114-120 is an n-type doped region (also referred to as an n-well) or a p-type doped region (also referred to as a p-well) depending on a type of device disposed in respective device regions 104-108. N-type doped regions are doped with n-type dopants, such as phosphorus, arsenic, other n-type dopant, or combinations thereof. P-type doped regions are doped with p-type dopants, such as boron (for example, $BF_2$), indium, other p-type dopant, or combinations thereof. In some implementations, one or more of doped regions 114-120 include a combination of p-type dopants and n-type dopants. Doped regions 114-120 can be formed directly on and/or in substrate 110, for example, providing a p-well structure, an n-well structure, a dual-well structure, a raised structure, or combinations thereof. An ion implantation process, a diffusion process, and/or other suitable doping process can be performed to form doped regions 114-120.

Various gate structures are disposed over substrate 110, such as a gate structure 124A, a gate structure 124B, a gate structure 124C, a gate structure 124D, and a gate structure 124E. Various deposition processes, lithography processes, etching processes, other suitable processes, or combinations thereof can be implemented to fabricate the gate stacks of gate structures 124A-124E. The deposition processes include CVD, physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

Gate structures 124A-124E include gate stacks configured to achieve desired functionality according to design requirements of IC device 100, such that gate structures 124A-124E include the same or different layers and/or materials. For example, gate structure 124A, 124B are configured to form a portion of a respective flash memory cell, and gate structures 124C-124E are configured to form a portion of a respective transistor. Gate structures 124A, 124B each have a height H1, which represents a combined thickness of the various layers of the gate stacks of gate structures 124A, 124B. Height H1 extends from a top surface of substrate 110 to a top surface of the gate stacks of gate structures 124A, 124B. Gate structures 124C-124E each have a height H2, which represents a combined thickness of the various layers of the gate stacks of gate structures 124C-124E. Height H2 extends from a top surface of substrate 110 to a top surface of the gate stacks of gate structures 124C-124E. In the depicted embodiment, height H1 is greater than height H2, which causes a topography variation $\Delta_1$ between device region 102 and device regions 104-108. Topography variation $\Delta_1$ is a difference between height H1 and height H2 (in other words, $\Delta_1$=H1-H2). Topography variation $\Delta_1$ can be transferred to subsequently formed layers of IC device 100, which can degrade performance of IC device 100. The present disclosure provides a solution for overcoming the challenges presented by such topography variation, as described below. In some implementations, height H1 is greater than or equal to about 2,500 Å, and height H2 is less than about 2,500 Å (for example, about 1,500 Å). In some implementations, topography variance $\Delta_1$ is a distance (or height) between a top surface of a tallest component in device region 102 and a top surface of a tallest component in device regions 104-108. In some implementations, gate structures 124A-124E can collectively be referred to as a device layer, where the device layer includes a high topography region (here, device region 102) and a low topography region (here, device regions 104-108).

Gate structure 124A has a gate stack that includes a tunnel oxide layer 126a, a floating gate layer 128a, a dielectric layer 130a, a control gate layer 132a, and a hard mask layer 134a. Gate structure 124B has a gate stack that includes a tunnel oxide layer 126b, a floating gate layer 128b, a dielectric layer 130b, a control gate layer 132b, and a hard mask layer 134b. Tunnel oxide layers 126a, 126b are disposed over substrate 110 and include any suitable material, such as silicon and/or oxygen (for example, silicon oxide). Floating gate layers 128a, 128b are disposed respectively on tunnel oxide layers 126a, 126b and include an electrically conductive material, such as polysilicon. In some implementations, floating gate layers 128a, 128b can include nano-islands including a semiconductor material, such as silicon and/or germanium. Dielectric layers 130a, 130b are respectively disposed on floating gate layers 128a, 128b and include a dielectric material. In some implementations, dielectric layers 130a, 130b include a multilayer structure, such as an oxide-nitride-oxide (ONO) structure. For example, dielectric layers 130a, 130b can include a first silicon-and-oxygen-containing layer disposed over floating gate layers 128a, 128b, a silicon-and-nitrogen-containing layer disposed over the first silicon-and-oxygen-containing layer, and a second silicon-and-oxygen-containing layer disposed over the silicon-and-nitrogen-containing layer. Control gate layers 132a, 132b are respectively disposed on dielectric layers 130a, 130b and include an electrically conductive material, such as polysilicon. In some implementations, the gate stacks of gate structures 124a, 124b can include various material combinations, such as metal-oxide-nitride-oxide-silicon (MONOS), silicon-oxide-nitride-silicon (SONOS), silicon-nitride-oxide-silicon (SNOS), metal-nitride-oxide-silicon (MNOS), or other suitable material combination. Hard mask layers 134a, 134b are disposed on respective control gate layers 132a, 132b and include any suitable material, such as silicon, nitrogen, and/or carbon (for example, silicon nitride or silicon carbide). In the depicted embodiment, the top surface of the gate stacks of gate structures 124A, 124B is a top surface of respective hard mask layers 134a, 134b, such that height H1 extends from a top surface of substrate 110 to a top surface of hard mask layers 134a, 134b.

Gate structure 124C has a gate stack that includes an interfacial layer 136a, a gate dielectric 138a, a gate electrode 140a, and a hard mask layer 142a; gate structure 124D has a gate stack that includes an interfacial layer 136b, a gate dielectric 138b, a gate electrode 140b, and a hard mask layer 142b; and gate structure 124E has a gate stack that includes an interfacial layer 136c, a gate dielectric 138c, a gate electrode 140c, and a hard mask layer 142c. Since gate structures 124C-124E correspond with different transistors, gate structures 124C-124E can include a different number, configuration, and/or materials of layers of interfacial layers 136a-136c, gate dielectrics 138a-138c, gate electrodes 140a-140c, and/or hard mask layers 142a-142c. For example, to optimize performance of transistors in device region 104 (here, the high voltage region), a thickness of gate dielectric 138a is greater than a thickness of gate dielectric 138b and/or gate dielectric 138c. Gate stacks of gate structures 124C-124E are fabricated according to a gate last process, a gate first process, or a hybrid gate last/gate first process. In gate last process implementations, one or more of gate structures 124C-124E include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectrics 138a-138c and/or gate electrodes 140a-140c are subsequently formed.

Interfacial layers 136a-136c are disposed on substrate 110 and include any suitable material, such as silicon and/or oxygen (for example, silicon oxide). Gate dielectrics 138a-138c are conformally disposed on respective interfacial layers 136a-136c and respective gate stack defining surfaces, such that gate dielectrics 138a-138c have a substantially uniform thickness. Gate dielectrics 138a-138c include a dielectric material, such as silicon oxide, high-k dielectric material, other suitable dielectric material, or combinations thereof. High-k dielectric material generally refers to dielectric materials having a high dielectric constant, for example, greater than that of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, gate dielectrics 138a-138c can include a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. Gate electrodes 140a-140c are disposed on respective gate dielectrics 138a-138c. Gate electrodes 140a-140c include an electrically conductive material. In some implementations, gate electrodes 140a-140c include multiple layers, such as one or more capping layers, work function layers, glue/barrier layers, and/or metal fill (or bulk) layers. A capping layer can include a material that prevents or eliminates diffusion and/or reaction of constituents between gate dielectrics 138a-138c and other layers of gate structures 124C-124E. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. Hard mask layers 142a-142c are disposed on respective gate dielectrics 138a-138c and respective gate electrodes 140a-140c. Hard mask layers 142a-142c include any suitable material, such as silicon, nitrogen, and/or carbon (for example, silicon nitride or silicon carbide). In the depicted embodiment, the top surface of the gate stacks of gate structures 124C-124E is a top surface of respective hard mask layers 142a-142c, such that height H2 extends from a top surface of substrate 110 to a top surface of hard mask layers 142a-142c.

Gate structures 124A-124E further include respective gate spacers, such as gate spacers 144a, gate spacers 144b, gate spacers 144c, gate spacers 144d, and gate spacers 144e. Gate spacers 144a-144e are disposed adjacent to (for example, along sidewalls of) respective gate stacks. Gate spacers 144a-144e are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and gate stacks of gate structures 124A-124E and subsequently anisotropically etched to form gate spacers 144a-144e. In some implementations, gate spacers 144a-144e include a multilayer structure, such as a first dielectric layer that includes silicon nitride and a second dielectric layer that includes silicon oxide. In some implementations, gate spacers 144a-144e include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 110 and subsequently anisotropically etched to form a first spacer set adjacent to the gate stacks, and a second dielectric layer including silicon and nitrogen can be deposited over substrate 110 and subsequently anisotropically etched to form a second spacer set adjacent to the first spacer set. In some implementations, gate spacers 144a-144e include the same or different materials, layers, sets, and/or configurations depending on design requirements of IC device 100.

Various source/drain features 146 are disposed in substrate 110. In the depicted embodiment, each of gate structures 124A-124E is disposed over substrate 110, such that each of gate structures 124A-124E interposes source/drain features 146. Channel regions disposed in substrate 110 can span between source/drain features 146, underlying each of gate structures 124A-124E, such that current can flow between respective source/drain features 146 during operation. Source/drain features 146 include lightly doped source and drain (LDD) features and/or heavily doped source and drain (HDD) features, which can be formed before and/or after forming gate spacers 144a-144e. In some implementations, source/drain features 146 are formed by implanting and/or diffusing n-type dopants, p-type dopants, or combinations thereof into substrate 110 depending on a desired transistor configuration (for example, PMOS or NMOS). An annealing process, such as a rapid thermal annealing (RTA) and/or a laser annealing, can be performed to activate dopants of source/drain features 146. Source/drain features 146 can further include epitaxial source/drain features disposed on and/or in substrate 110. For example, semiconductor material is epitaxially grown on substrate 110, such that epitaxial source/drain features are fully embedded or partially embedded (for example, having a top surface that is higher than a top surface of substrate 110). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 110. Epitaxial source/drain features can include any suitable material, such as silicon and/or germanium, and can include n-type dopants and/or p-type dopants. In some implementations, epitaxial source/drain features can include silicon-and-germanium-containing layers doped with boron, carbon, other p-type dopant, or combinations thereof (for example, a Si:Ge:B epitaxial layer or a Si:Ge:C epitaxial layer). In some implementations, epitaxial source/drain features can include silicon-containing or silicon-carbon-containing layers doped with phosphorous, arsenic, other n-type dopant, or combinations thereof (for example, a Si:P epitaxial layer, a Si:C epitaxial layer, or a Si:C:P epitaxial layer). In some implementations, epitaxial source/drain features include materials and/or dopants that achieve desired tensile stress and/or compressive stress in the channel region. In some implementations, epitaxial source/drain features are doped during deposition by adding impurities to a source material of the epitaxy process. In some implementations, epitaxial source/drain features are doped by an ion implantation process subsequent to a deposition process.

Silicide layers 148 are formed on source/drain features 146. In some implementations, silicide layers 148 are formed by depositing a metal layer over source/drain features 146. The metal layer includes any material suitable for promoting silicide formation, such as nickel, platinum, palladium, vanadium, titanium, cobalt, tantalum, ytterbium, zirconium, other suitable metal, or combinations thereof. IC device 100 is then heated (for example, subjected to an annealing process) to cause constituents of source/drain features 146 (for example, silicon and/or germanium) to react with the metal. Silicide layers 148 thus include metal and a constituent of source/drain features 146 (for example, silicon and/or germanium). In some implementations, silicide layers 148 include nickel silicide, titanium silicide, or cobalt silicide. Any un-reacted metal, such as remaining portions of the metal layer, is selectively removed by any suitable process, such as an etching process.

Figure 2B:
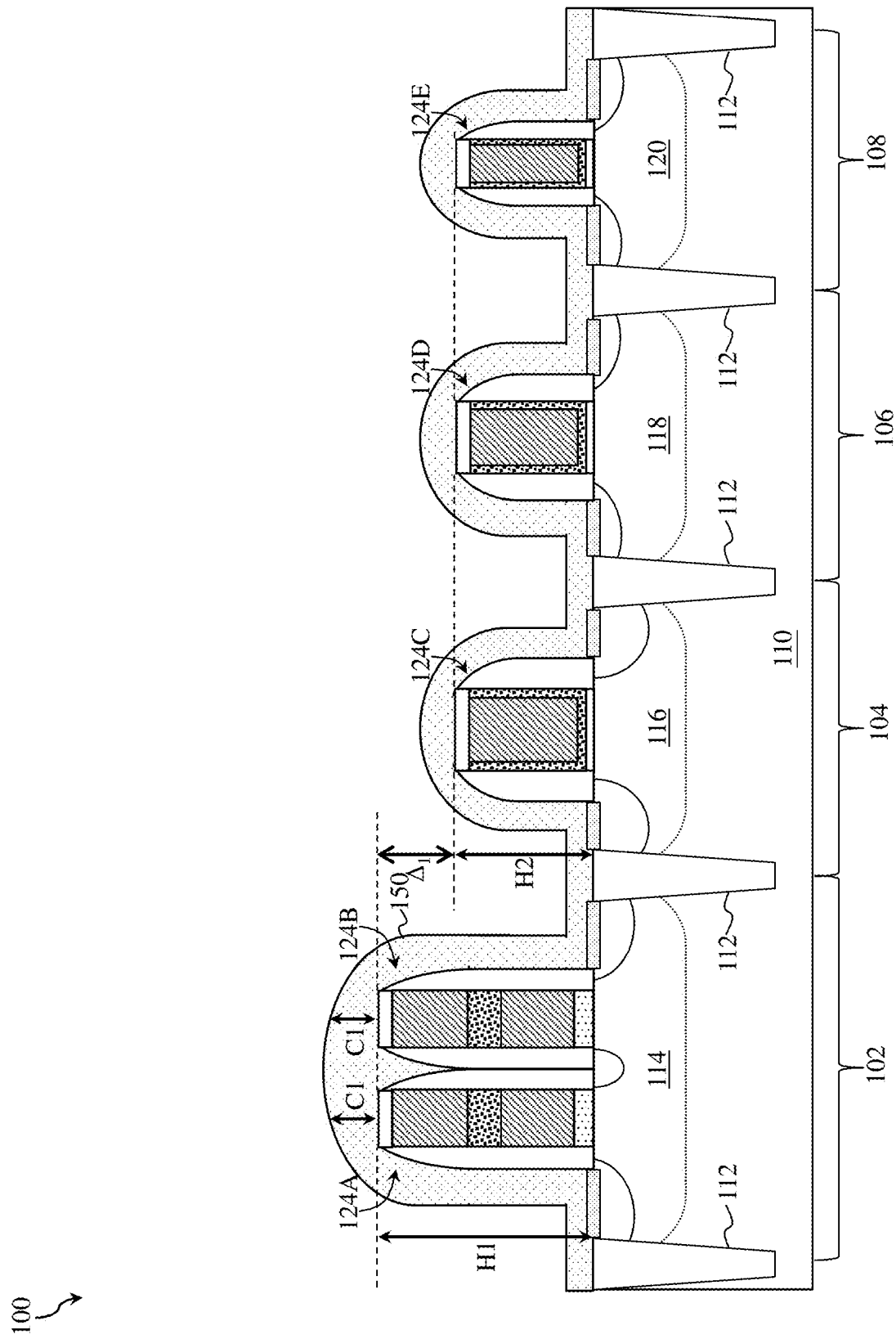

Turning to FIG. 2B, a contact etch stop layer (CESL) 150 is formed over IC device 100, particularly over gate structures 124A-124E in device regions 102-108. In some implementations, CESL 150 is conformally deposited over gate structures 124A-124E, such that CESL 150 has substantially the same thickness over gate structures 124A-124E and various other IC features, such as isolation features 112 and/or source/drain features 146. In the depicted embodiment, CESL 150 has a thickness C1 over gate structures 124A-124E. In some implementations, thickness C1 is about 600 Å to about 700 Å (for example, about 650 Å). Other thickness profiles of CESL 150 are contemplated by the present disclosure. For example, in some implementations, a thickness of CESL 150 disposed on top surfaces of gate stacks of gate structures 124A-124E is greater than a thickness of CESL 150 disposed on top surfaces of spacers 144a-144e. CESL 150 includes a material having a different etch characteristic than other features of IC device 100, such as hard mask layers 134a, 134b, hard mask layers 142a-142c, gate spacers 144a-144e, and/or subsequently formed ILDs. In some implementations, CESL 150 includes silicon, oxygen, nitrogen, carbon, other suitable CESL constituent, or combinations thereof. For example, CESL 150 includes silicon oxide, silicon nitride, silicon oxynitride, silicon carbide, or other suitable CESL material. In the depicted embodiment, CESL 150 includes silicon and nitrogen, such as silicon nitride. In some implementations, CESL 150 includes a material configured to achieve a desired stress, such as a tensile stress or a compressive stress, depending on a transistor type over which CESL 150 will remain in IC device 100. In some implementations, CESL 150 has a multilayer structure, including for example, more than one material layer. CESL 150 is formed by CVD, PECVD, sub-atmospheric CVD (SACVD), LPCVD, ALD, plasma enhanced ALD (PEALD), molecular layer deposition (MLD), plasma impulse CVD (PICVD), other suitable method, or combinations thereof.

Figure 2C:
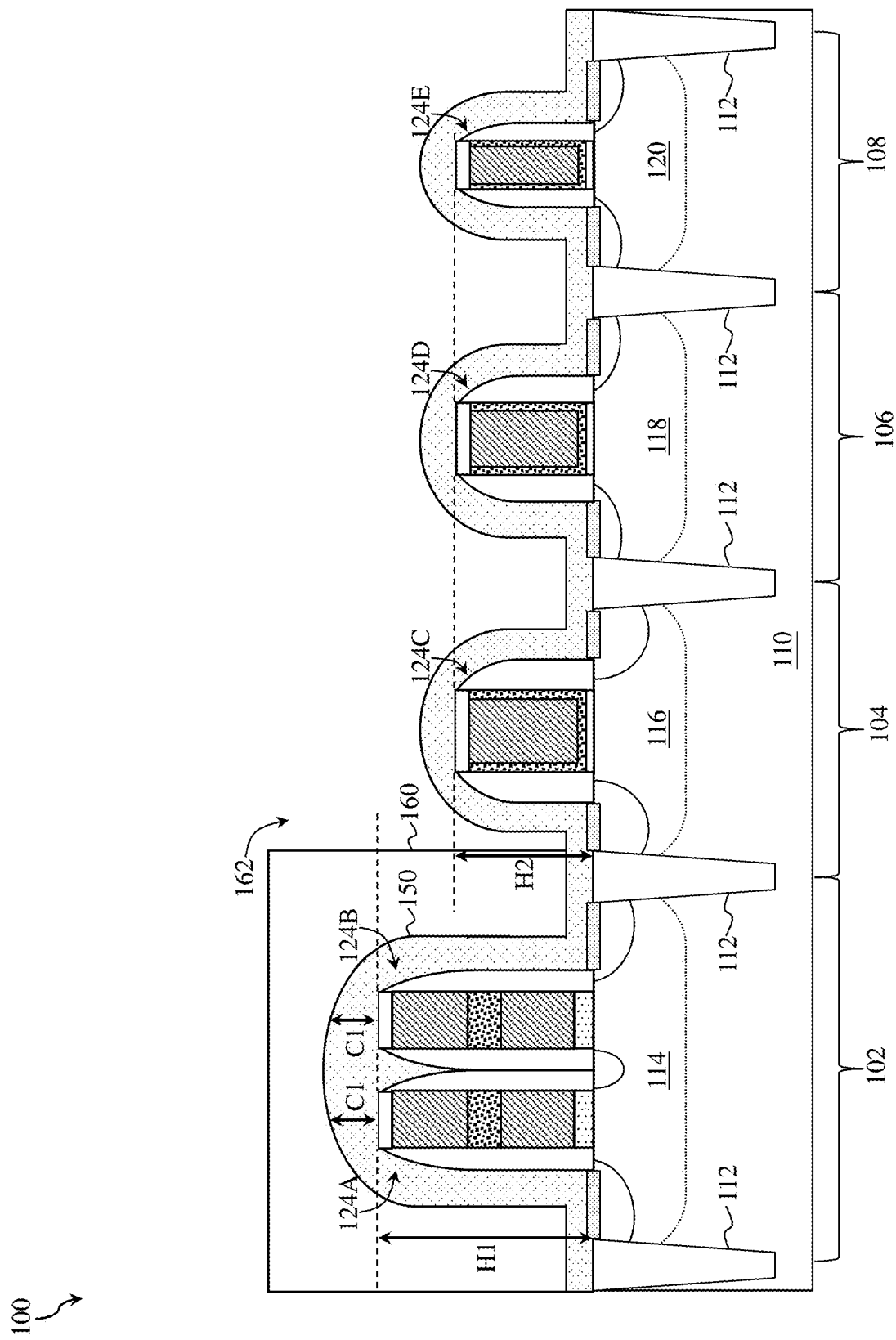

Turning to FIG. 2C, a mask layer 160 is formed over CESL 150 in high topography regions of IC device 100. For example, mask layer 160 covers device region 102 including gate structures 124A, 124B having height H1. An opening 162 of mask layer 160 exposes CESL 150 in low topography regions of IC device 100, such as device regions 104-108 including gate structures 124C-124E having height H2. Mask layer 160 functions as a CESL cut mask, which is used to remove CESL 150 from low topography regions of IC device 100. In the depicted embodiment, mask layer 160 is a resist layer, which is also referred to as a photoresist layer, photosensitive layer, imaging layer, patterning layer, and/or radiation sensitive layer. Mask layer 160 thus includes a material that is sensitive to radiation used during a lithography exposure process, such as DUV radiation, EUV radiation, e-beam radiation, ion beam radiation, and/or other suitable radiation. Alternatively, in some implementations, mask layer 160 includes a material having a different etch characteristic than CESL 150, such as silicon, amorphous silicon, semiconductor oxide (for example, silicon oxide (SiO$_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. In some implementations, mask layer 160 has a multilayer structure. For example, mask layer 160 can include a mask barrier layer disposed over CESL 150, and a mask layer disposed over the mask barrier layer. The mask barrier layer can include a material with high etch resistance that achieves desired etching selectivity (for example, between the mask barrier layer and the mask layer), such as a material including titanium and nitrogen (for example, TiN), and the mask layer can include a material that achieves desired etching selectivity (for example, between the mask layer and CESL 150).

Mask layer 160 is formed by a lithography process. For example, in some implementations, mask layer 160 is formed by spin coating a liquid resist material onto CESL 150. After spin coating the liquid resist material (but before performing an exposure process), a pre-bake process can be performed on mask layer 160, for example, to evaporate solvent and to densify the liquid resist material formed over CESL 150. In some implementations, before forming mask layer 160, an ARC layer is formed over CESL 150, such that mask layer 160 is formed over the ARC layer. The ARC layer can be a nitrogen-free ARC (NFARC) layer that includes a material such as silicon oxide, silicon oxygen carbide, PECVD silicon oxide, other suitable material, or combinations thereof. In some implementations, more than one layer (including one or more ARC layers) can be formed between mask layer 160 and CESL 150. Opening 162 is then formed by an exposure process. During the exposure process, mask layer 160 is illuminated with radiation (such as UV light, DUV light, or EUV light), where a mask blocks, transmits, and/or reflects radiation to mask layer 160 depending on a mask pattern of the mask and/or mask type (for example, binary mask, phase shift mask, or EUV mask), such that an image is projected onto mask layer 160 corresponds with the mask pattern. In the depicted embodiment, the radiation is patterned using a mask having a CESL cut pattern defined therein, such that the patterned radiation forms an image of the CESL cut pattern on mask layer 160. Since mask layer 160 is sensitive to radiation, exposed portions of mask layer 160 physically and/or chemically change in response to the exposure process, such that solubility of exposed portions to a developer increases or decreases. In some implementations, after the exposure process, a post-exposure baking (PEB) process is performed on mask layer 160. A developing process is then performed to dissolve exposed (or non-exposed) portions of mask layer 160 depending on characteristics of mask layer 160 and characteristics of a developing solution used in the developing process. In some implementations, a rinsing process is performed after the developing process, for example, to remove any residue and/or particles from IC device 100. In some implementations, a post-development baking (PDB) process is performed on mask layer 160. Alternatively, the exposure process can be implemented or replaced by other methods, such as maskless lithography, e-beam writing, ion-beam writing, and/or nanoimprint technology. In such implementations, the image can be projected onto mask layer 160 by directly modulating radiation according to the CESL cut pattern.

Figure 2D:
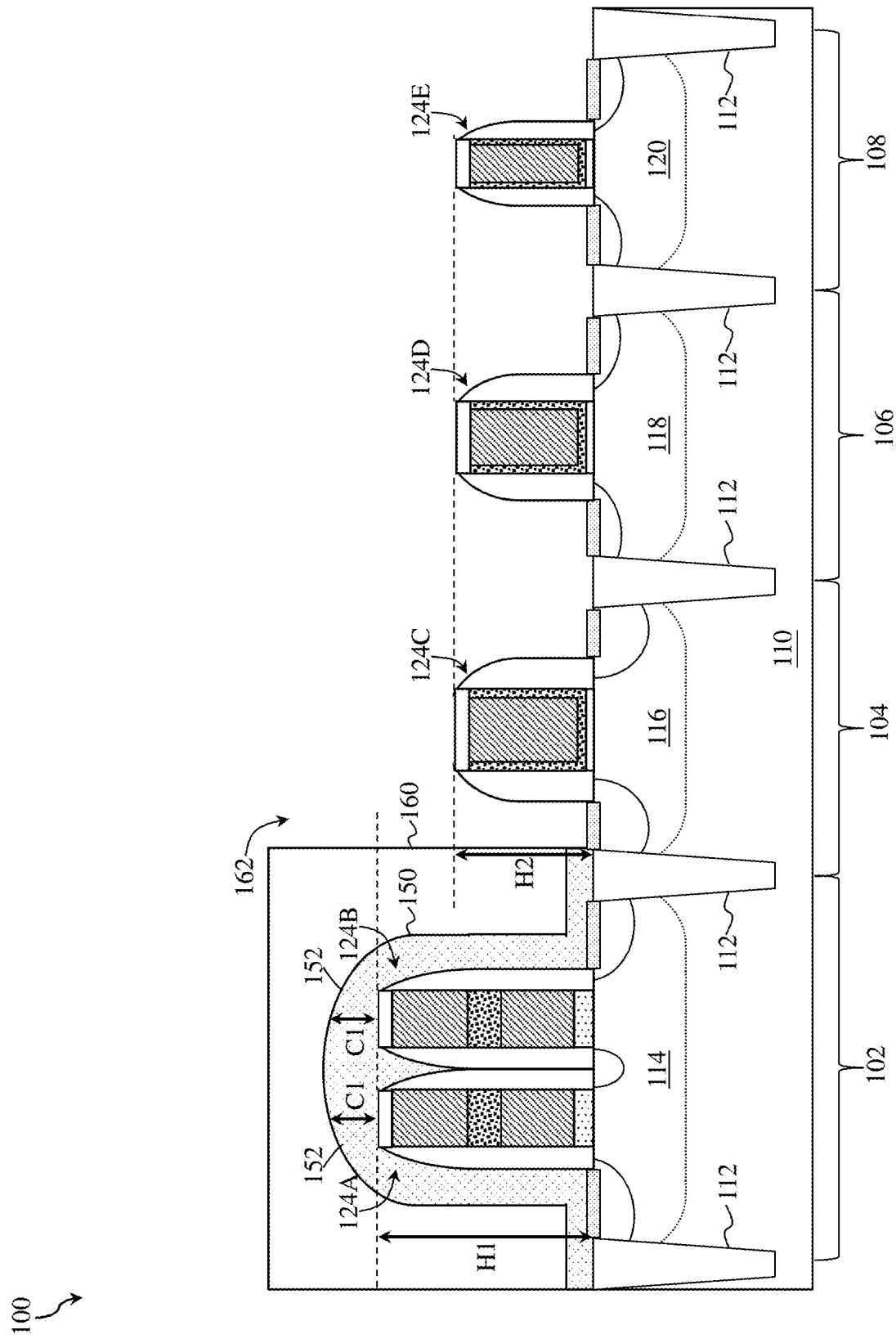

Turning to FIG. 2D, CESL 150 is removed from low topography regions of IC device 100. For example, CESL 150 is removed from device regions 104-108 including gate structures 124C-124E having height H2, thereby exposing gate structures 124C-124E. In the depicted embodiment, an etching process is performed to remove CESL 150, where mask layer 160 acts as an etch mask that protects CESL 150 in high topography regions of IC device 100 during the etching process. The etching process is a wet etching process, a dry etching process, other suitable etching process, or combinations thereof. In some implementations, the etching process selectively etches CESL 150 without substantially etching mask layer 160, silicide layers 148, gate spacers 144c-144e, and/or hard mask layers 142a-142c.

Figure 2E:
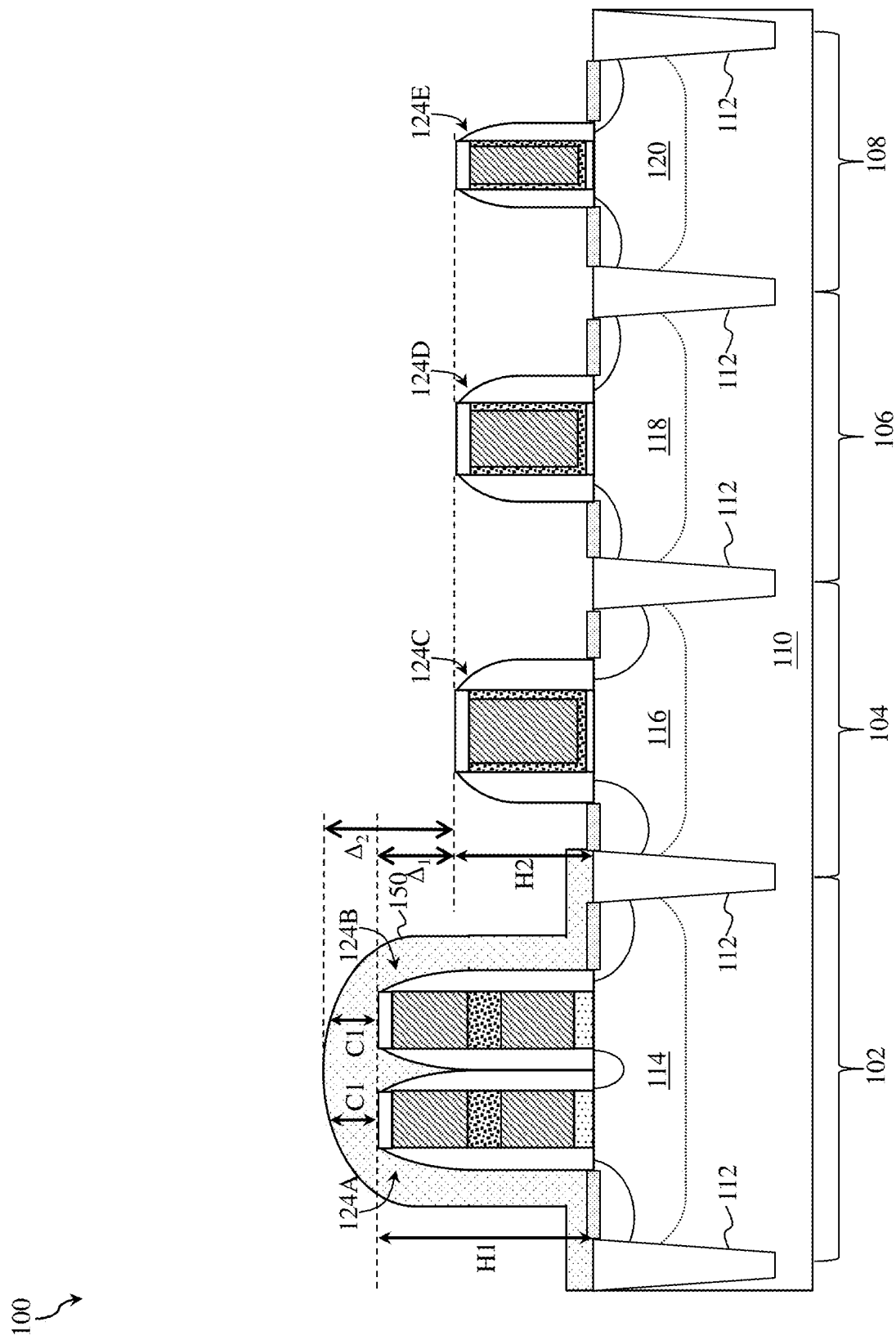

Turning to FIG. 2E, mask layer 160 is removed from high topography regions of IC device 100. For example, mask layer 160 is removed by a resist stripping process, thereby exposing CESL 150 disposed over device region 102, particularly over gates structures 124A, 124B. In some implementations, mask layer 160 is removed by an etching process, other suitable process, or combinations thereof. Remaining CESL 150 changes surface topography of IC device 100. In the depicted embodiment, since CESL 150 remains over high topography regions of IC device 100, CESL 150 increases a topography variation between device region 102 and device regions 104-108. For example, a topography variation $\Delta_2$ between device region 102 and device regions 104-108 is greater than topography variation $\Delta_1$. Topography variation $\Delta_2$ is a difference between a sum of height H1 of gate structures 124A, 124B and thickness C1 disposed over gate structures 124A, 124B and height H2 of gate structures 124C-124E (in other words, $\Delta_2=(H1+C1)-H2$). Topography variation $\Delta_2$ is thus a distance (or height) between a top surface of CESL 150 in device region 102 and a top surface of hard mask layers 142a-142c in device regions 104-108. In some implementations, topography variance 42 is a distance (or height) between a top surface of a tallest component in device region 102 and a top surface of a tallest component in device regions 104-108.

Figure 2F:
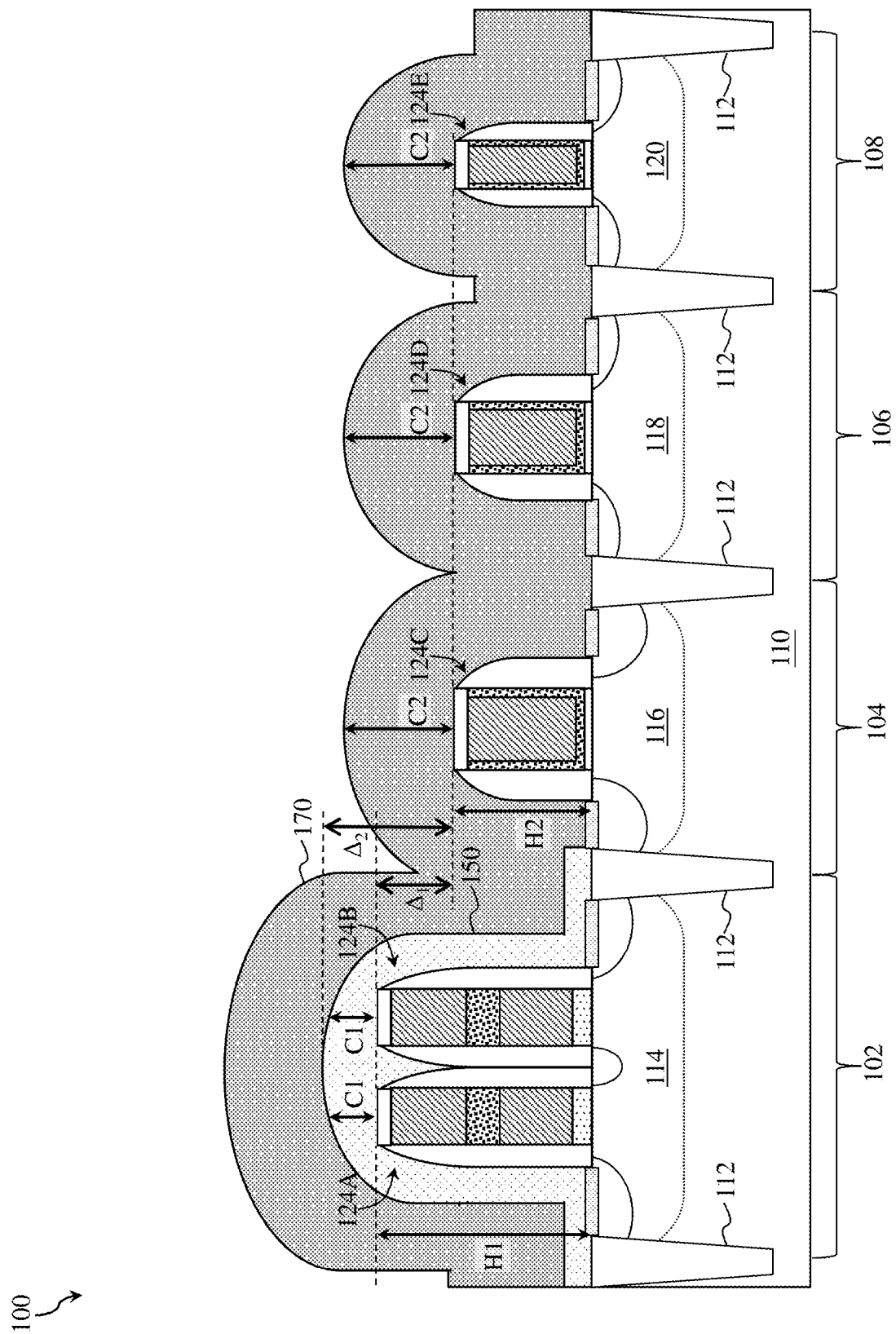

Turning to FIG. 2F, a CESL 170 is formed over IC device 100, particularly over gate structures 124A-124E in device regions 102-108. In the depicted embodiment, CESL 170 is formed over CESL 150 in device region 102. In some implementations, CESL 170 is conformally deposited over IC features of IC device 100, such that CESL 170 has substantially the same thickness over CESL 150, gate structures 124C-124E, and various other IC features, such as isolation features 112 and/or source/drain features 146. In the depicted embodiment, CESL 170 has a thickness C2 over gate structures 124C-124E. Thickness C2 is configured to minimize topography variation between device region 102 and device regions 104-108. For example, in the depicted embodiment, thickness C2 is greater than thickness C1. In some implementations, thickness C2 is about 700 Å to about 850 Å (for example, about 750 Å). Other thickness profiles of CESL 170 are contemplated by the present disclosure. For example, in some implementations, a thickness of CESL 170 disposed on top surfaces of gate structures 124C-124E and/or CESL 150 is greater than a thickness of CESL 170 disposed on top surfaces of spacers 144a-144e. CESL 170 includes a material having a different etch characteristic than other features of IC device 100, such as hard mask layers 134a, 134b, hard mask layers 142a-142c, gate spacers 144a-144e, CESL 150, and/or subsequently formed ILDs. In some implementations, CESL 170 includes silicon, oxygen, nitrogen, carbon, other suitable CESL constituent, or combinations thereof. For example, CESL 170 includes silicon oxide, silicon nitride, silicon oxynitride, silicon carbide, or other suitable CESL material. In some implementations, CESL 170 includes the same material as CESL 150. In some implementations, CESL 170 includes a different material than CESL 150. In the depicted embodiment, CESL 170 includes silicon and nitrogen, such as silicon nitride. In some implementations, CESL 170 includes a material configured to achieve a desired stress, such as a tensile stress or a compressive stress, depending on a transistor type over which CESL 170 will remain in IC device 100. In some implementations, CESL 170 has a multilayer structure, including for example, more than one material layer. CESL 170 is formed by CVD, PECVD, SACVD, LPCVD, ALD, PEALD, MLD, PICVD, other suitable method, or combinations thereof.

Figure 2G:
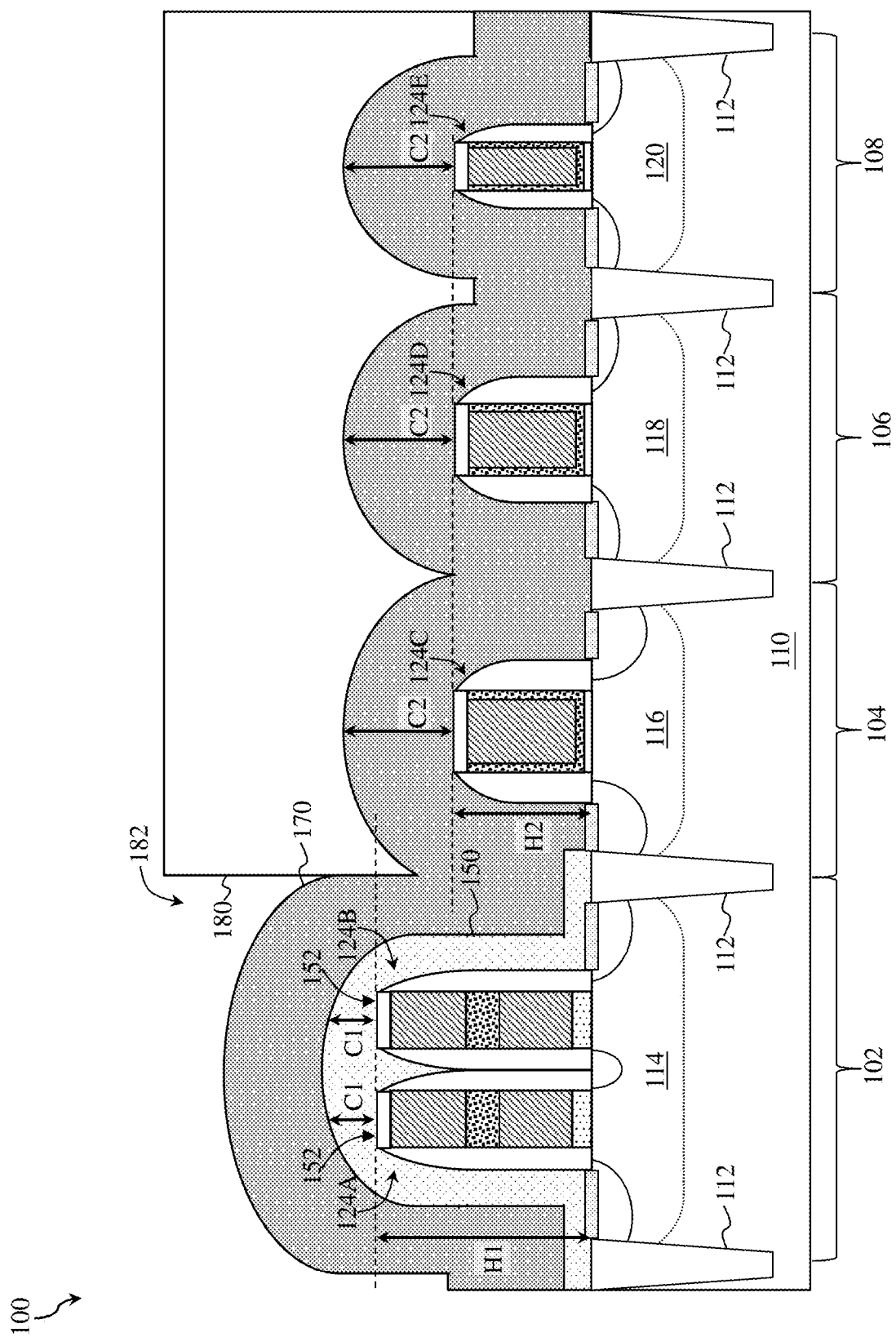

Turning to FIG. 2G, a mask layer 180 is formed over CESL 150 in low topography regions of IC device 100. For example, mask layer 180 covers device regions 104-108 including gate structures 124C-124E having height H2. An opening 182 of mask layer 180 exposes CESL 170 in high topography regions of IC device 100, such as device region 102 including gate structures 124A, 124B having height H2. Mask layer 180 functions as a CESL cut mask, which is used to remove CESL 170 from high topography regions of IC device 100. In the depicted embodiment, mask layer 180 is a resist layer. Mask layer 180 thus includes a material that is sensitive to radiation used during a lithography exposure process, such as DUV radiation, EUV radiation, e-beam radiation, ion beam radiation, and/or other suitable radiation. Alternatively, in some implementations, mask layer 180 includes a material having a different etch characteristic than CESL 170, such as silicon, amorphous silicon, semiconductor oxide (for example, $SiO_2$), semiconductor nitride (for example, SiN), semiconductor oxynitride (for example, SiON), and/or semiconductor carbide (for example, SiC), other semiconductor material, and/or other dielectric material. In some implementations, mask layer 180 has a multi-layer structure. For example, mask layer 180 can include a mask barrier layer disposed over CESL 170, and a mask layer disposed over the mask barrier layer. The mask barrier layer can include a material with high etch resistance that achieves desired etching selectivity (for example, between the mask barrier layer and the mask layer), such as a material including titanium and nitrogen (for example, TiN), and the mask layer can include a material that achieves desired etching selectivity (for example, between the mask layer and CESL 180).

Mask layer 180 is formed by a lithography process. For example, in some implementations, mask layer 180 is formed by spin coating a liquid resist material onto CESL 170. After spin coating the liquid resist material (but before performing an exposure process), a pre-bake process can be performed on mask layer 180, for example, to evaporate solvent and to densify the liquid resist material formed over CESL 170. In some implementations, before forming mask layer 180, an ARC layer is formed over CESL 170, such that mask layer 180 is formed over the ARC layer. The ARC layer can be an NFARC layer that includes a material such as $SiO_2$, SOC, PECVD-$SiO_2$, other suitable material, or combinations thereof. In some implementations, more than one layer (including one or more ARC layers) can be formed between mask layer 180 and CESL 170. Opening 182 is then formed by an exposure process. During the exposure process, mask layer 180 is illuminated with radiation (such as UV light, DUV light, or EUV light), where a mask blocks, transmits, and/or reflects radiation to mask layer 180 depending on a mask pattern of the mask and/or mask type (for example, binary mask, phase shift mask, or EUV mask), such that an image is projected onto mask layer 180 that corresponds with the mask pattern. In the depicted embodiment, the radiation is patterned using a mask having a CESL cut pattern defined therein, such that the patterned radiation forms an image of the CESL cut pattern on mask layer 180. Since mask layer 180 is sensitive to radiation, exposed portions of mask layer 180 physically and/or chemically change in response to the exposure process, such that solubility of exposed portions to a developer increases or decreases. In some implementations, after the exposure process, a PEB process is performed on mask layer 180. A developing process is then performed to dissolve exposed (or non-exposed) portions of mask layer 180 depending on characteristics of mask layer 180 and characteristics of a developing solution used in the developing process. In some implementations, a rinsing process is performed after the developing process, for example, to remove any residue and/or particles from IC device 100. In some implementations, a PDB process is performed on mask layer 180. Alternatively, the exposure process can be implemented or replaced by other methods, such as maskless lithography, e-beam writing, ion-beam writing, and/or nanoimprint technology. In such implementations, the image can be projected onto mask layer 180 by directly modulating radiation according to the CESL cut pattern.

Figure 2H:
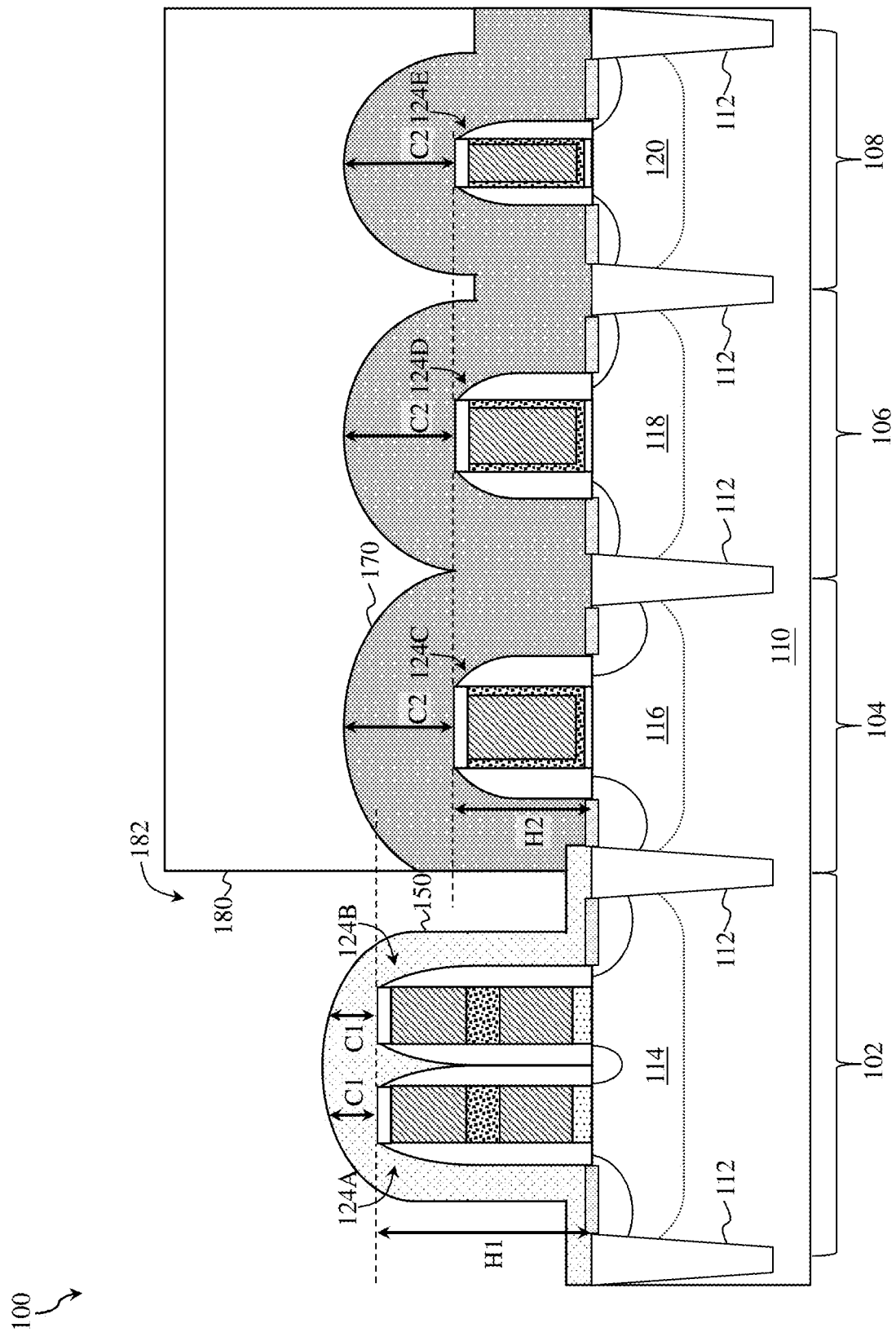

Turning to FIG. 2H, CESL 170 is removed from high topography regions of IC device 100. For example, CESL 170 is removed from device region 102 including gate structures 124A, 124B having height H1, thereby exposing CESL 150. In the depicted embodiment, an etching process is performed to remove CESL 170, where mask layer 180 acts as an etch mask that protects CESL 170 in low topography regions of IC device 100 during the etching process. The etching process is a wet etching process, a dry etching process, other suitable etching process, or combinations thereof. In some implementations, the etching process selectively etches CESL 170 without substantially etching mask layer 180 and/or CESL 150.

Figure 2I:
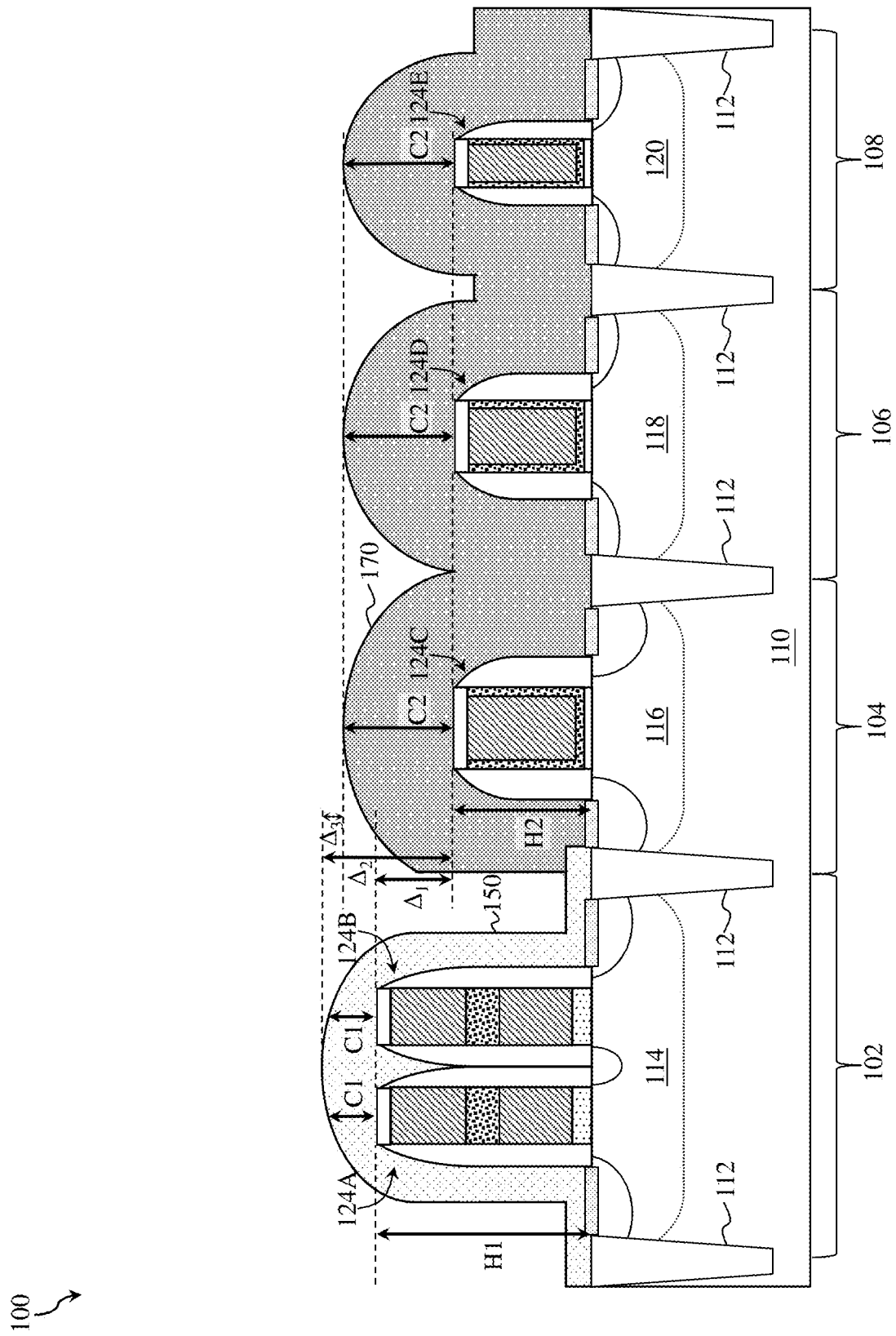

Turning to FIG. 2I, mask layer 180 is removed from low topography regions of IC device 100. For example, mask layer 180 is removed by a resist stripping process, thereby exposing CESL 170 disposed over device regions 104-108, particularly over gates structures 124C-124E. In some implementations, mask layer 180 is removed by an etching process, other suitable process, or combinations thereof. Remaining CESL 170 changes surface topography of IC device 100. In the depicted embodiment, since CESL 170 remains over low topography regions of IC device 100 and CESL 170 has thickness C2 (which is greater than thickness C1), CESL 170 reduces a topography variation between device region 102 and device regions 104-108. For example, a topography variation $\Delta_3$ between device region 102 and device regions 104-108 is less than topography variation $\Delta_1$. Topography variation $\Delta_3$ is a difference between a sum of height H1 of gate structures 124A, 124B and thickness C1 of CESL 150 disposed over gate structures 124A, 124B and a sum of height H2 of gate structures 124C-124E and thickness C2 of CESL 170 disposed over gate structures 124C-124E (in other words, $\Delta_3=(H1+C1)-(H2+C2)$). Topography variation $\Delta_3$ is thus a distance (or height) between a top surface of CESL 150 in device region 102 and a top surface of CESL 170 in device regions 104-108. In some implementations, to ensure that the device layer exhibits topography that will minimize (or eliminate) topography variations in subsequently formed layers, such as subsequently formed ILD layers, thickness C1 and thickness C2 are configured to achieve topography variation $\Delta_3$ that is less than or equal to about 10%. In some implementations, thickness C2 of CESL 170 is configured to eliminate any topography variation between device region 102 and device regions 104-108 (for example, $\Delta_3=0$). In some implementations, topography variation $\Delta_3$ is a distance (or height) between a top surface of a tallest component in device region 102 and a top surface of a tallest component in device regions 104-108.

Figure 2J:
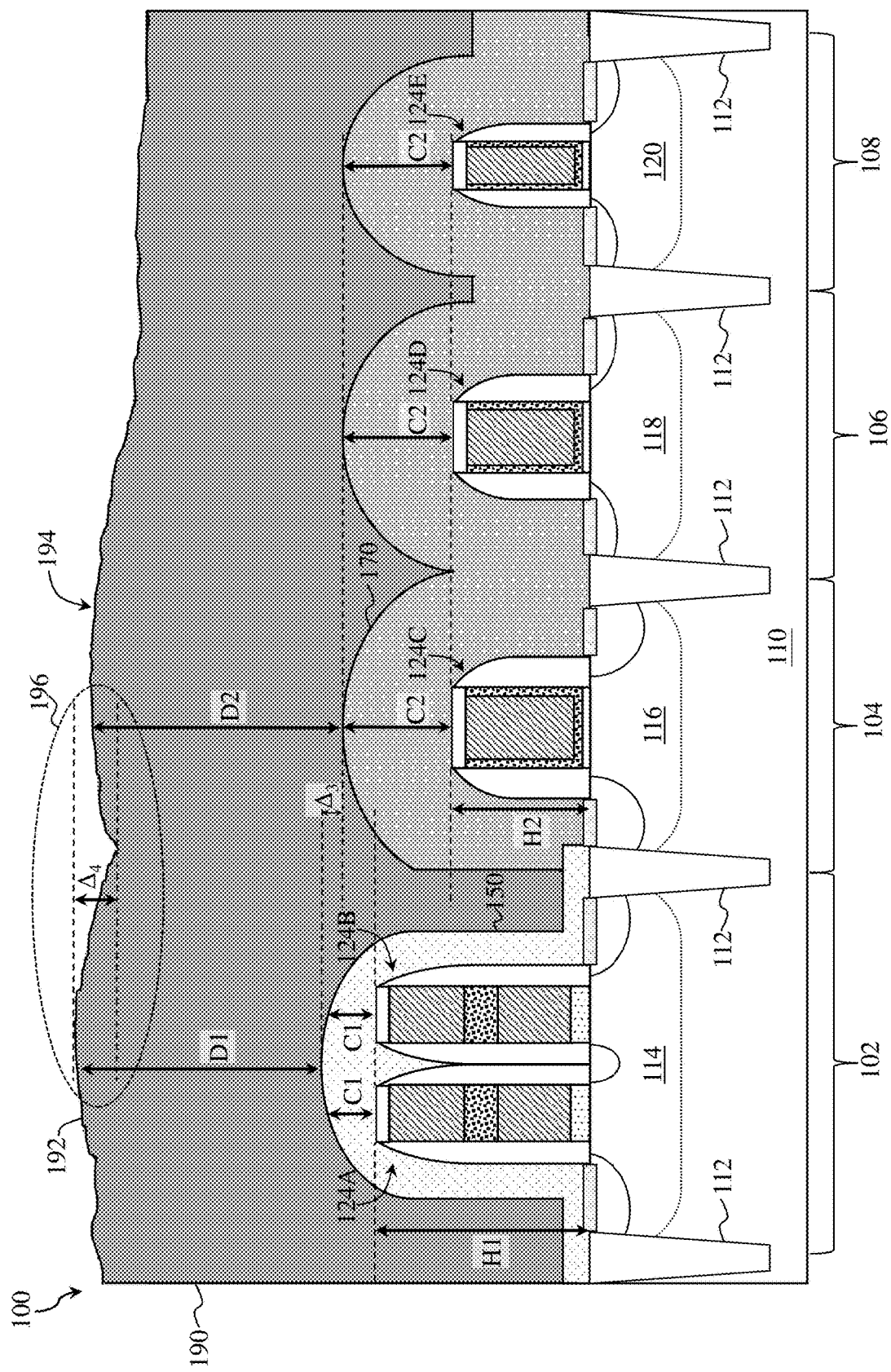

Turning to FIG. 2J, an ILD layer 190 is formed over IC device 100, particularly over CESL 150 and CESL 170. In some implementations, a thickness of ILD layer 190 is about 5,000 Å to about 6,000 Å. ILD layer 190 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK® (Dow Chemical, Midland, Mich.), polyimide, other low-k dielectric material, or combinations thereof. In the depicted embodiment, ILD layer 190 includes a low-k dielectric material (generally referred to as a low-k dielectric layer). In some implementations, low-k dielectric material generally refers to materials having a dielectric constant (k) that is less than about 3. In some implementations, ILD layer 190 has a multilayer structure having multiple dielectric materials. ILD layer 190 is formed over CESL 150 and CESL 170 by a deposition process, such as CVD, PVD, ALD, HDPCVD, MOCVD, RPCVD, PECVD, LPCVD, ALCVD, APCVD, other suitable deposition process, or combinations thereof. In some implementations, ILD layer 190 is formed by a flowable CVD (FCVD) process that includes, for example, depositing a flowable material (such as a liquid compound) over CESL 150 and CESL 170 and converting the flowable material to a solid material by a suitable technique, such as thermal annealing and/or ultraviolet radiation treating.

A top surface 192 of ILD layer 190 exhibits a surface profile 194. Since topography of ILD layer 190 mimics topography of its underlying device layer, a topography variation $\Delta_4$ of ILD layer 190 at an interface region 196 of a high topography region (here, device region 102) and a low topography region (here, device region 104) is minimized because the proposed method utilizes different thickness CESLs on different height device features (here, thickness C1 on gate structures 124A, 124B and thickness C2 on gate structures 124C-124E) to "smooth" topography variation in the device layer. ILD layer 190 thus exhibits "smoother" topography compared to an ILD layer formed over a CESL having the same thickness over different height device features. In some implementations, thickness C1 and thickness C2 are configured to minimize topography variance and achieve an ILD topography ratio given by:

$$|(H1+C1+D1)-(H2+C2+D2)|/(H1+C1+D1) \leq 10\%,$$

where D1 is a thickness of ILD layer 190 over a top surface of gate stacks of gate structures 124A, 124B and D2 is a thickness of ILD layer 190 over a top surface of gate stacks of gate structures 124C-124E. It is noted that a range of thickness C1 and a range of thickness C2 is specifically configured to facilitate the topography variation minimizing function of CESL 150 and CESL 170. In other words, if a value of thickness C1 and/or a value of thickness C2 is too high or too low, CESL 150 and/or CESL 170 may not achieve desired efficacy in terms of reducing (or eliminating) topography variations between device region 102 and device regions 104-108. In some implementations, configuring thickness C1 of CESL 150 and thickness C2 of CESL 170 to minimize topography variance $\Delta_3$ reduces a likelihood of a breakage of ILD layer 190 at interface 196, maintaining integrity of IC device 100. For example, in conventional fabrication methods where an ILD layer is formed over a CESL layer having the same thickness over gate structures 124A-124E, a "break" may occur in the ILD layer between device region 102 and device region 104, such that the ILD layer is non-continuous. This can result, for example, when the ILD layer does not form on a top corner portion of the CESL on gate structure 124B because of the topography variation between gate structure 124B and gate structure 124C. Absence of the ILD layer on the top corner portion of the CESL on gate structure 124B can result in undesirable etching of the CESL and/or gate structure 124B. Furthermore, the undesirable etching can cause unintentional coupling of later deposited conductive materials to gate structure 124B, which can ultimately lead to device failure. Such problems are eliminated (or substantially reduced) by configuring thickness C1 and thickness C2 to minimize topography variance of the underlying device layer.

Figure 2K:
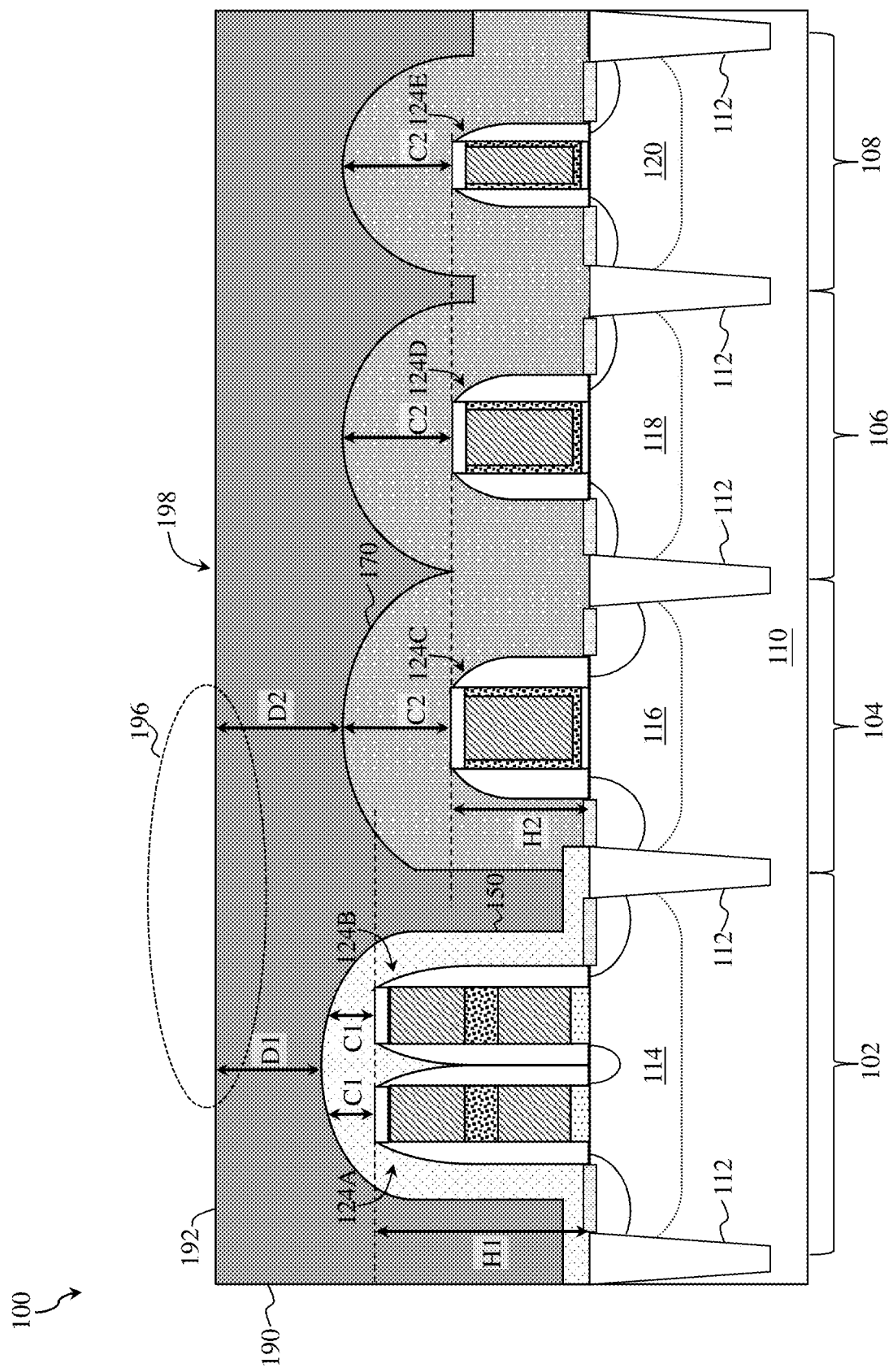

Turning to FIG. 2K, a CMP process and/or other planarization process is performed to planarize top surface 192 of ILD layer 190, such that ILD layer 190 has a substantially planar surface. In some implementations, by minimizing topography variance $\Delta_4$, a surface profile 198 of top surface 192 is substantially flat and any topography variance is minimal. Utilizing different thickness CESLs on different height devices can thus also improve CMP uniformity and/or reduce ILD missing from edges of IC device 100.

Figure 2L:
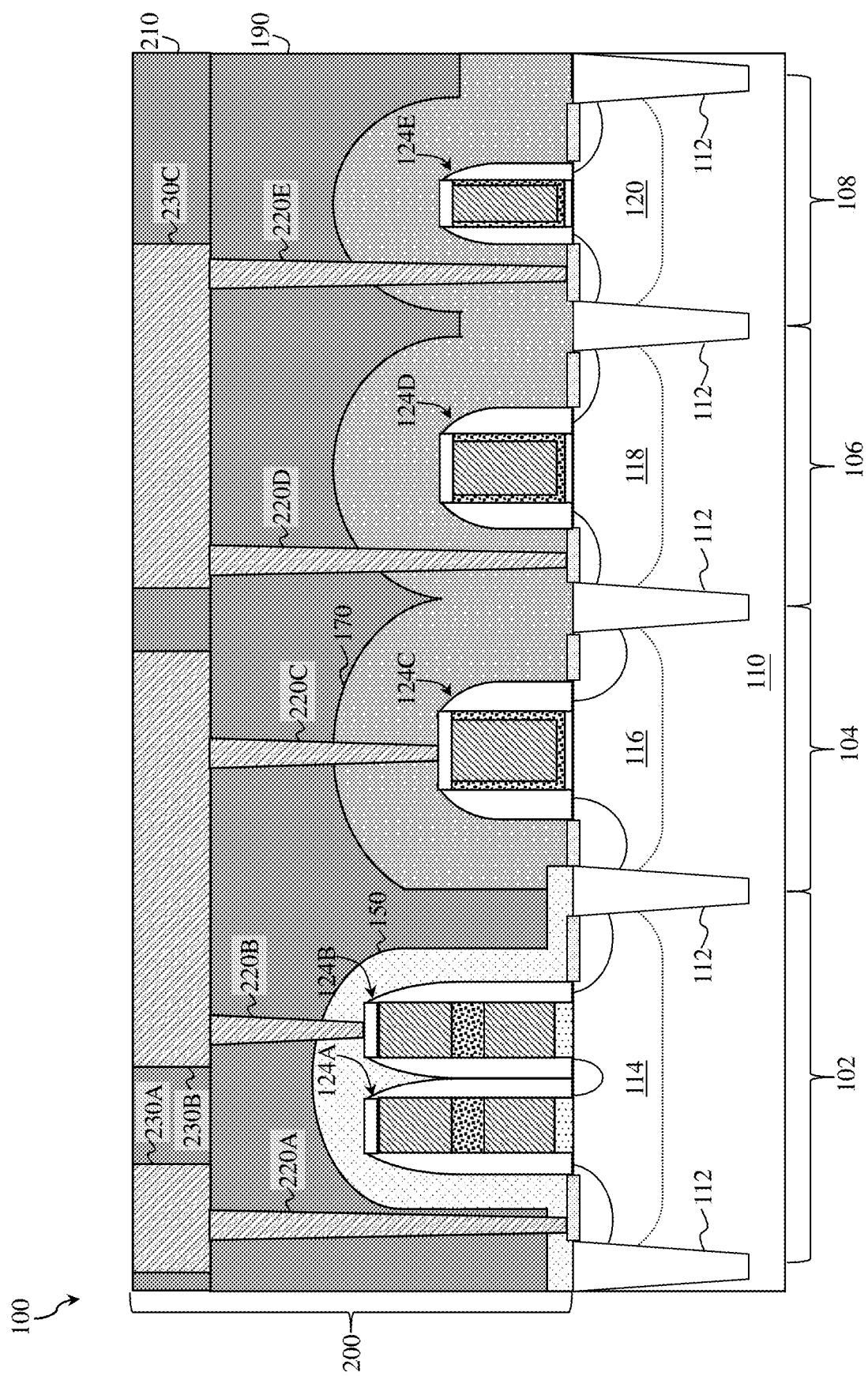

Turning to FIG. 2L, ILD layer 190, CESL 150, and CESL 170 are a portion of a multilayer interconnect (MLI) feature 200 disposed over substrate 110, where processing continues to form various features of MLI feature 200. MLI feature 200 electrically couples various devices and/or components of IC device 100, such that the various devices and/or components can operate as specified by design requirements of IC device 100. MLI feature 200 includes a combination of dielectric layers and electrically conductive layers (for example, metal layers) configured to form various interconnect structures. The conductive layers are configured to form vertical interconnect features, such as contacts and/or vias, and/or horizontal interconnect features, such as conductive lines. Vertical interconnect features typically connect horizontal interconnect features in different layers (or different planes) of MLI feature 200. During operation of IC device 100, the interconnect features are configured to route signals between the devices and/or the components of IC device 100 and/or distribute signals (for example, clock signals, voltage signals, and/or ground signals) to the devices and/or the components of IC device 100. It is noted that though MLI feature 200 is depicted with a given number of dielectric layers and conductive layers, the present disclosure contemplates MLI feature 200 having more or less dielectric layers and/or conductive layers.

An intermetal dielectric (IMD) layer 210 of MLI feature 200 is formed over ILD layer 190. IMD layer 210 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, IMD layer 210 includes a low-k dielectric material. IMD layer 210 can include a multilayer structure. IMD layer 210 can be formed by a deposition process, such as CVD, PVD, ALD, HDPCVD, MOCVD, RPCVD, PECVD, LPCVD, ALCVD, APCVD, other suitable deposition process, or combinations thereof. In some implementations, IMD layer 210 is formed by an FCVD process. In some implementations, a CESL is disposed between IMD layer 210 and ILD layer 190.

Contacts 220A-220E and conductive lines 230A-230C (collectively referred to as a metal one (M1) layer of MLI feature 200) are disposed in one or more dielectric layers of MLI feature 200, such as ILD layer 190 and/or IMD layer 210, to form interconnect structures. Contacts 220A-220E electrically couple and/or physically couple IC device features, such as gate stacks of gate structures 124A-124E and/or source/drain features 146, to conductive lines 230A-230C. Contacts 220A-220E and conductive lines 230A-230C include any suitable electrically conductive material, such as Ta, Ti, Al, Cu, Co, W, TiN, TaN, other suitable conductive materials, or combinations thereof. Various conductive materials can be combined to provide contacts 220A-220E and conductive lines 230A-230C with various layers, such as a barrier layer, an adhesion layer, a liner layer, a bulk layer, other suitable layer, or combinations thereof. In some implementations, contacts 220A-220E include Ti, TiN, W, and/or Co; and conductive lines 230A-230C include Cu, Co, and/or Ru. Contacts 220A-220E and conductive lines 230A-230C are formed by patterning ILD layer 190 and/or IMD layer 210. Patterning ILD layer 190 and/or IMD layer 210 can include lithography processes and/or etching processes to form openings (trenches), such as contact openings, line openings, and/or via openings in respective ILD layer 190 and/or IMD layer 210. In some implementations, the lithography processes include forming a resist layer over ILD layer 190 and/or IMD layer 210, exposing the resist layer to patterned radiation, and developing the exposed resist layer, thereby forming a patterned resist layer that can be used as a masking element for etching opening(s) in ILD layer 190 and/or IMD layer 210. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layer 190, IMD layer 210, contacts 220A-220E, and/or conductive lines 230A-230C.

Figure 3:
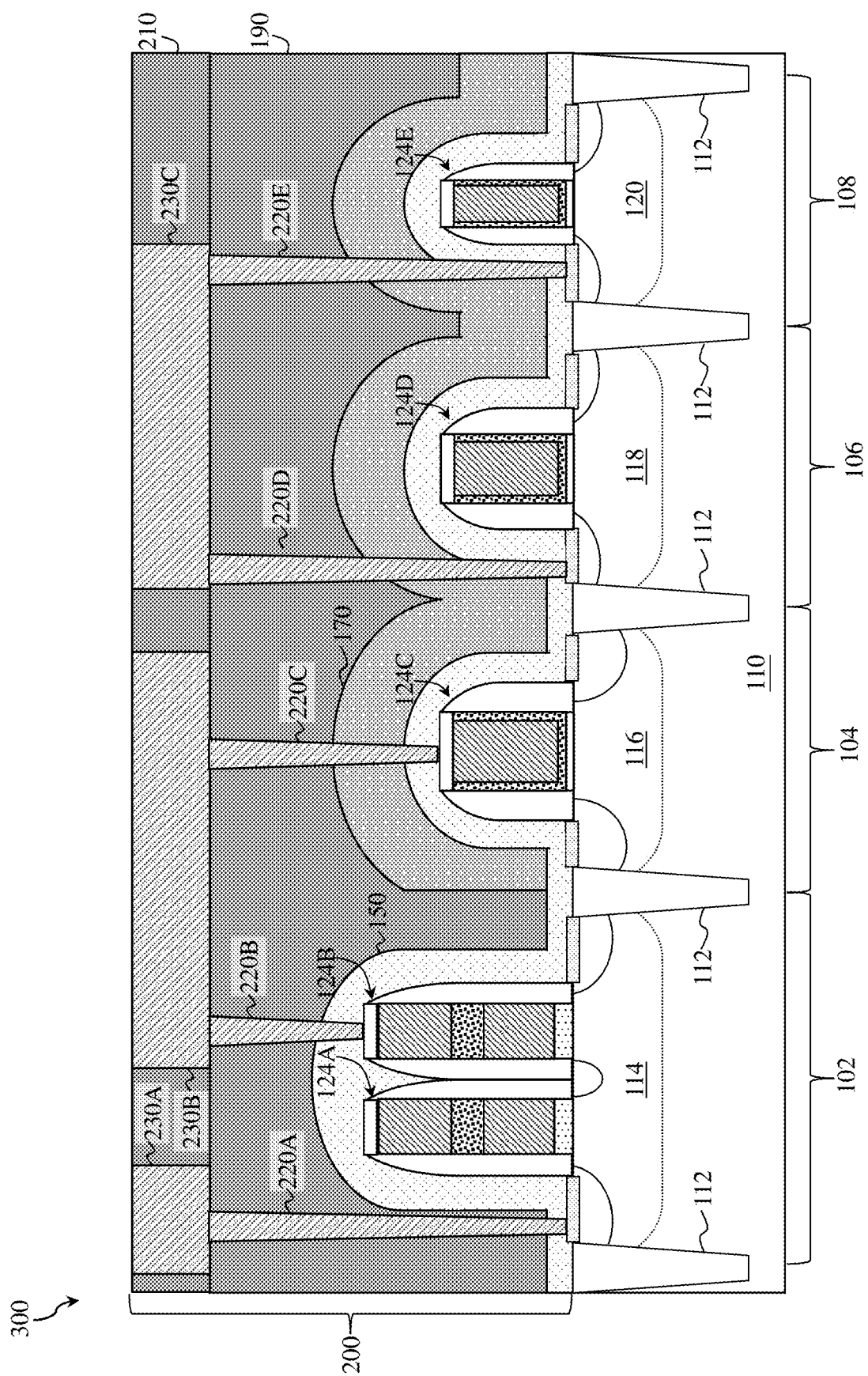
FIG. 3 is a fragmentary cross-sectional view of another integrated circuit device, in portion or entirety, according to various aspects of the present disclosure.

FIG. 3 is a fragmentary cross-sectional view of an IC device 300, in portion or entirety, that can be fabricated using the methods described herein, such as method 10 of FIG. 1, according to various aspects of the present disclosure. IC device 300 is similar in many respects to IC device 100. Similar features in FIG. 3 and FIGS. 2A-2L are thus identified by the same reference numerals for clarity and simplicity. In FIG. 3, IC device 300 is fabricated similar to IC device 100, except CESL 150 is not removed from low topography regions, such as device regions 104-108. In such implementations, processing associated with FIGS. 2C-2E is omitted, and proceeds with processing associated with FIGS. 2F-2L. Accordingly, CESL 150 is disposed over gate structures 124A, 124B in device region 102, and CESL 150 and CESL 170 is disposed over gate structures 124C-124E in device regions 104-108. Thicknesses of CESL 150 and CESL 170 are configured to minimize topography variation $\Delta_3$, thereby minimizing topography variation of ILD layer 190. FIG. 3 has been simplified for the sake of clarity to better understand the inventive concepts of the present disclosure. Additional features can be added in IC device 300, and some of the features described below can be replaced, modified, or eliminated in other embodiments of IC device 300.

The present disclosure provides for many different embodiments. Methods for improving ILD layer topography and resulting integrated circuit devices are disclosed herein. The methods disclosed herein may be implemented in any of a variety of device types. For example, aspects of the present disclosure may be implemented to form ILD layers suitable for planar field-effect transistors (FETs), multi-gate transistors (planar or vertical), such as fin-like FET (FinFET) devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other integrated circuit devices that can benefit from the methods for improving ILD layer topography described herein.

An exemplary method includes forming a first contact etch stop layer over a first region of a wafer, forming a second contact etch stop layer over the second region of the wafer, and forming an interlayer dielectric (ILD) layer over the first contact etch stop layer and the second contact etch stop layer. A first topography variation exists between the first region and a second region of the wafer and the first contact etch stop layer has a first thickness. The second contact etch stop layer has a second thickness that is different than the first thickness to reduce the first topography variation to a second topography variation between the first region and the second region. In some implementations, the second topography variation is a difference in a height of a topmost surface of the first contact etch stop layer in the first region and a height of a topmost surface of the second contact etch stop layer in the second region, where the difference is less than or equal to about 10%. In some implementations, a first gate structure having a first height is disposed over the wafer in the first region and a second gate structure having a second height is disposed over the wafer in the second region, where the first topography variation is caused by the first height being different than the second height. In some implementations, the second topography variation is caused by any difference between a first sum of the first height and the first thickness and a second sum of the second height and the second thickness.

In some implementations, the method further includes forming an intermetal dielectric layer over the ILD layer. In some implementations, the first contact etch stop layer is formed by depositing the first contact etch stop layer over the first region and the second region and etching the first contact etch stop layer from over the second region. In some implementations, the second contact etch stop layer is formed by depositing the second contact etch stop layer over the first region and the second region and etching the second contact etch stop layer from over the first region. In some implementations, forming the first contact etch stop layer further includes performing a first lithography process to form a first mask layer over the first contact etch stop layer over the first region and removing the first mask layer after etching the first contact etch stop layer from over the second region. In some implementations, forming the second contact etch stop layer further includes performing a second lithography process to form a second mask layer over the second contact etch stop layer over the second region and removing the second mask layer after etching the second contact etch stop layer from over the first region. In some implementations, the first contact etch stop layer and the second contact etch stop layer include different material. In some implementations, the first contact etch stop layer and the second contact etch stop layer include the same material.

Another method exemplary method includes forming a first contact etch stop layer over a first gate structure having a first height, forming a second contact etch stop layer over a second gate structure having a second height that is less than the first height, and forming an interlayer dielectric (ILD) layer over the first contact etch stop layer and the second contact etch stop layer. The first contact etch stop layer has a first thickness and the second contact etch stop layer has a second thickness that is greater than the first thickness. In some implementations, a difference between a first sum of the first height and the first thickness and a second sum of the second height and the second thickness is less than or equal to about 10%. In some implementations, the first contact etch stop layer is formed before the second contact etch stop layer. In some implementations, the first contact etch stop layer is formed after the second contact etch stop layer. In some implementations, forming the ILD layer includes depositing a low-k dielectric material over the first contact etch stop layer and the second contact etch stop layer and performing a planarization process on the low-k dielectric material, thereby planarizing a top surface of the low-k dielectric material.

In some implementations, forming the first contact etch stop layer over the first gate structure and the second contact etch stop layer over the second gate structure includes depositing a first material layer having the first thickness over the first gate structure and the second gate structure, etching the first material layer over the second gate structure, depositing a second material layer having the second thickness over the second gate structure and the first material layer over the first gate structure, and etching the second material layer over the first material layer. In some implementations, a first lithography process is performed to form a first mask layer that covers the first material layer over the first gate structure during the etching of the first material layer. In some implementations, a second lithography process is performed to form a second mask layer that covers the second material layer over the second gate structure during the etching of the second material layer. In some implementations, the first mask layer and the second mask layer are formed by forming a patterned resist layer. In some implementations, forming the first contact etch stop layer over the first gate structure and the second contact etch stop layer over the second gate structure includes depositing a first material layer over the first gate structure and the second gate structure, depositing a second material layer over the first material layer, and removing the second material layer from over the first gate structure, such that the first material layer forms the first contact etch stop layer having the first thickness over the first gate structure and the first material layer and the second material layer form the second contact etch stop layer over the second gate structure.

An exemplary integrated circuit device includes a first gate structure having a first height disposed over a substrate in a first region, a second gate structure having a second height disposed over the substrate in a second region, a first contact etch stop layer disposed over the first gate structure, a second contact etch stop layer disposed over the second gate structure, and an interlayer dielectric layer disposed over the first contact etch stop layer and the second contact etch stop layer. The second height is less than the first height. The first contact etch stop layer has a first thickness and the second contact etch stop layer has a second thickness that is greater than the first thickness. The first contact etch stop layer and the second contact etch stop layer overlap at an interface of the first region and the second region. In some implementations, a difference between a sum of the first height and the first thickness and a sum of the second height and the second thickness is less than or equal to about 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first contact etch stop layer over a first region of a wafer, wherein a first topography variation exists between the first region and a second region of the wafer and the first contact etch stop layer has a first thickness;
   forming a second contact etch stop layer over the second region of the wafer, wherein the second contact etch stop layer has a second thickness that is different than the first thickness to reduce the first topography variation to a second topography variation between the first region and the second region; and
   forming an interlayer dielectric (ILD) layer over the first contact etch stop layer and the second contact etch stop layer.

2. The method of claim 1, wherein the second topography variation is a difference in a height of a topmost surface of the first contact etch stop layer in the first region and a height of a topmost surface of the second contact etch stop layer in the second region, wherein the difference is less than or equal to about 10%.

3. The method of claim 1, wherein:
   the forming the first contact etch stop layer includes:
      depositing the first contact etch stop layer over the first region and the second region, and
      etching the first contact etch stop layer from over the second region; and
   the forming the second contact etch stop layer includes:
      depositing the second contact etch stop layer over the first region and the second region, and
      etching the second contact etch stop layer from over the first region.

4. The method of claim 3, wherein:
   the forming the first contact etch stop layer further includes:
      performing a first lithography process to form a first mask layer over the first contact etch stop layer over the first region, and
      removing the first mask layer after etching the first contact etch stop layer from over the second region; and
   the forming the second contact etch stop layer further includes:
      performing a second lithography process to form a second mask layer over the second contact etch stop layer over the second region, and
      removing the second mask layer after etching the second contact etch stop layer from over the first region.

5. The method of claim 1, wherein a first gate structure having a first height is disposed over the wafer in the first region and a second gate structure having a second height is disposed over the wafer in the second region, wherein the first topography variation is caused by the first height being different than the second height.

6. The method of claim 5, wherein the second topography variation is caused by any difference between a first sum of the first height and the first thickness and a second sum of the second height and the second thickness.

7. The method of claim 1, wherein the first contact etch stop layer and the second contact etch stop layer include different material.

8. The method of claim 1, wherein the first contact etch stop layer and the second contact etch stop layer include the same material.

9. The method of claim 1, further comprising forming an intermetal dielectric layer over the ILD layer.

10. A method comprising:
forming a first contact etch stop layer over a first gate structure having a first height, wherein the first contact etch stop layer has a first thickness;
forming a second contact etch stop layer over a second gate structure having a second height that is less than the first height, wherein the second contact etch stop layer has a second thickness that is greater than the first thickness; and
forming an interlayer dielectric (ILD) layer over the first contact etch stop layer and the second contact etch stop layer.

11. The method of claim 10, wherein a difference between a first sum of the first height and the first thickness and a second sum of the second height and the second thickness is less than or equal to about 10%.

12. The method of claim 10, wherein the first contact etch stop layer is formed before the second contact etch stop layer.

13. The method of claim 10, wherein the first contact etch stop layer is formed after the second contact etch stop layer.

14. The method of claim 10, wherein the forming the first contact etch stop layer over the first gate structure and the forming the second contact etch stop layer over the second gate structure includes:
depositing a first material layer having the first thickness over the first gate structure and the second gate structure;
etching the first material layer over the second gate structure;
depositing a second material layer having the second thickness over the second gate structure and the first material layer over the first gate structure; and
etching the second material layer over the first material layer.

15. The method of claim 14, further comprising:
performing a first lithography process to form a first mask layer that covers the first material layer over the first gate structure during the etching of the first material layer; and
performing a second lithography process to form a second mask layer that covers the second material layer over the second gate structure during the etching of the second material layer.

16. The method of claim 15, wherein the forming the first mask layer and the forming the second mask layer each include forming a patterned resist layer.

17. The method of claim 10, wherein the forming the first contact etch stop layer over the first gate structure and the forming the second contact etch stop layer over the second gate structure includes:
depositing a first material layer over the first gate structure and the second gate structure;
depositing a second material layer over the first material layer; and
removing the second material layer from over the first gate structure, such that the first material layer forms the first contact etch stop layer having the first thickness over the first gate structure and the first material layer and the second material layer form the second contact etch stop layer over the second gate structure.

18. The method of claim 10, wherein the forming the ILD layer includes:
depositing a low-k dielectric material over the first contact etch stop layer and the second contact etch stop layer; and
performing a planarization process on the low-k dielectric material, thereby planarizing a top surface of the low-k dielectric material.

19. A method comprising:
depositing a first dielectric layer having a first thickness over a first gate structure in a first region and a second gate structure in a second region;
forming a first mask layer that covers the first dielectric layer in the first region and exposes the first dielectric layer in the second region;
removing the exposed first dielectric layer in the second region;
removing the first mask layer;
depositing a second dielectric layer having a second thickness over the first dielectric layer in the first region and the second gate structure in the second region, wherein the second thickness is greater than the first thickness;
forming a second mask layer that covers the second dielectric layer in the second region and exposes the second dielectric layer in the first region, wherein the second mask layer covers a portion of the second dielectric layer disposed over the first dielectric layer proximate a boundary between the first region and the second region;
removing the exposed second dielectric layer in the first region;
removing the second mask layer; and
forming a third dielectric layer over the first dielectric layer in the first region and the second dielectric layer in the second region.

20. The method of claim 19, wherein a material of the first dielectric layer is different than a material of the third dielectric layer, and a material of the second dielectric layer is different than the material of the third dielectric layer.

* * * * *